United States Patent
Raffiñan

(10) Patent No.: US 9,423,457 B2
(45) Date of Patent: Aug. 23, 2016

(54) SELF-TEST SOLUTION FOR DELAY LOCKED LOOPS

(71) Applicant: Edzel Gerald Dela Cruz Raffiñan, Mandaluyong (PH)

(72) Inventor: Edzel Gerald Dela Cruz Raffiñan, Mandaluyong (PH)

(73) Assignee: BiTMICRO Networks, Inc., Fremont, CA (US)

( * ) Notice: Subject to any disclaimer, the term of this patent is extended or adjusted under 35 U.S.C. 154(b) by 102 days.

(21) Appl. No.: 14/214,216

(22) Filed: Mar. 14, 2014

(65) Prior Publication Data
US 2014/0285211 A1      Sep. 25, 2014

Related U.S. Application Data

(60) Provisional application No. 61/785,256, filed on Mar. 14, 2013.

(51) Int. Cl.
*G01R 31/02* (2006.01)
*G01R 25/00* (2006.01)
*G01R 31/317* (2006.01)
*G11C 29/02* (2006.01)
*G11C 29/50* (2006.01)

(52) U.S. Cl.
CPC ........ *G01R 31/31725* (2013.01); *G11C 29/023* (2013.01); *G11C 29/028* (2013.01); *G11C 29/50012* (2013.01)

(58) Field of Classification Search
None
See application file for complete search history.

(56) References Cited

U.S. PATENT DOCUMENTS

| 4,752,871 A | 6/1988 | Sparks |
| 5,111,058 A | 5/1992 | Martin |
| RE34,100 E | 10/1992 | Hartness |
| 5,222,046 A | 6/1993 | Kreifels et al. |
| 5,297,148 A | 3/1994 | Harari et al. |
| 5,341,339 A | 8/1994 | Wells |
| 5,371,709 A | 12/1994 | Fisher et al. |

(Continued)

FOREIGN PATENT DOCUMENTS

| JP | 2005142859 A | * 6/2005 |
| JP | 2005-309847 | 11/2005 |

(Continued)

OTHER PUBLICATIONS

JP2005142859 (A) English Abstract, Jun. 2, 2005.*
(Continued)

*Primary Examiner* — Patrick Assouad
*Assistant Examiner* — Haidong Zhang
(74) *Attorney, Agent, or Firm* — Stephen Uriarte

(57) ABSTRACT

A built-in self test (BIST) circuit and method is provided to test a first and a second DLL. The first DLL has a first delay input, a first clock input disposed to receive a clock input signal, and a first clock output that provides a first clock output signal delayed in comparison with the clock input signal. The second DLL has a second delay input, a second clock input disposed to receive the clock input signal, and a second clock output signal delayed in comparison with the clock input signal. The BIST circuitry provides a first delay amount over the first delay input creating a start offset between the first and second clock output signals. If the first DLL is functioning properly the start offset between the output signals should remain unchanged even after the BIST circuitry provides an additional common delay amount to the first and second delay inputs.

26 Claims, 6 Drawing Sheets

(56) References Cited

U.S. PATENT DOCUMENTS

| | | |
|---|---|---|
| 5,379,401 A | 1/1995 | Robinson et al. |
| 5,388,083 A | 2/1995 | Assar et al. |
| 5,396,468 A | 3/1995 | Harari et al. |
| 5,406,529 A | 4/1995 | Asano |
| 5,432,748 A | 7/1995 | Hsu et al. |
| 5,448,577 A | 9/1995 | Wells et al. |
| 5,459,850 A | 10/1995 | Clay et al. |
| 5,479,638 A | 12/1995 | Assar et al. |
| 5,485,595 A | 1/1996 | Assar et al. |
| 5,488,711 A | 1/1996 | Hewitt et al. |
| 5,500,826 A | 3/1996 | Hsu et al. |
| 5,509,134 A | 4/1996 | Fandrich et al. |
| 5,513,138 A | 4/1996 | Manabe et al. |
| 5,524,231 A | 6/1996 | Brown |
| 5,530,828 A | 6/1996 | Kaki et al. |
| 5,535,328 A | 7/1996 | Harari et al. |
| 5,535,356 A | 7/1996 | Kim et al. |
| 5,542,042 A | 7/1996 | Manson |
| 5,542,082 A | 7/1996 | Solhjell |
| 5,548,741 A | 8/1996 | Watanabe |
| 5,559,956 A | 9/1996 | Sukegawa |
| 5,568,423 A | 10/1996 | Jou et al. |
| 5,568,439 A | 10/1996 | Harari |
| 5,572,466 A | 11/1996 | Sukegawa |
| 5,594,883 A | 1/1997 | Pricer |
| 5,602,987 A | 2/1997 | Harari et al. |
| 5,603,001 A | 2/1997 | Sukegawa et al. |
| 5,606,529 A | 2/1997 | Honma et al. |
| 5,606,532 A | 2/1997 | Lambrache et al. |
| 5,619,470 A | 4/1997 | Fukumoto |
| 5,627,783 A | 5/1997 | Miyauchi |
| 5,640,349 A | 6/1997 | Kakinuma et al. |
| 5,644,784 A | 7/1997 | Peek |
| 5,682,509 A | 10/1997 | Kabenjian |
| 5,737,742 A | 4/1998 | Achiwa et al. |
| 5,787,466 A | 7/1998 | Berliner |
| 5,796,182 A | 8/1998 | Martin |
| 5,799,200 A | 8/1998 | Brant et al. |
| 5,802,554 A | 9/1998 | Caceres et al. |
| 5,819,307 A | 10/1998 | Iwamoto et al. |
| 5,822,251 A | 10/1998 | Bruce et al. |
| 5,875,351 A | 2/1999 | Riley |
| 5,881,264 A | 3/1999 | Kurosawa |
| 5,913,215 A | 6/1999 | Rubinstein et al. |
| 5,918,033 A | 6/1999 | Heeb et al. |
| 5,943,421 A | 8/1999 | Grabon |
| 5,956,743 A | 9/1999 | Bruce et al. |
| 6,000,006 A | 12/1999 | Bruce et al. |
| 6,014,709 A | 1/2000 | Gulick et al. |
| 6,076,137 A | 6/2000 | Asnaashari |
| 6,098,119 A | 8/2000 | Surugucchi et al. |
| 6,128,303 A | 10/2000 | Bergantino |
| 6,215,875 B1 | 4/2001 | Nohda |
| 6,230,269 B1 | 5/2001 | Spies et al. |
| 6,298,071 B1 | 10/2001 | Taylor et al. |
| 6,363,441 B1 | 3/2002 | Beniz et al. |
| 6,363,444 B1 | 3/2002 | Platko et al. |
| 6,397,267 B1 | 5/2002 | Chong, Jr. |
| 6,404,772 B1 | 6/2002 | Beach et al. |
| 6,496,939 B2 | 12/2002 | Portman et al. |
| 6,526,506 B1 | 2/2003 | Lewis |
| 6,529,416 B2 | 3/2003 | Bruce et al. |
| 6,557,095 B1 | 4/2003 | Henstrom |
| 6,678,754 B1 | 1/2004 | Soulier |
| 6,744,635 B2 | 6/2004 | Portman et al. |
| 6,757,845 B2 | 6/2004 | Bruce |
| 6,857,076 B1 | 2/2005 | Klein |
| 6,901,499 B2 | 5/2005 | Aasheim et al. |
| 6,922,391 B1 | 7/2005 | King et al. |
| 6,961,805 B2 | 11/2005 | Lakhani et al. |
| 6,970,446 B2 | 11/2005 | Krischer et al. |
| 6,970,890 B1 | 11/2005 | Bruce et al. |
| 6,980,795 B1 | 12/2005 | Hermann et al. |
| 7,103,684 B2 | 9/2006 | Chen et al. |
| 7,174,438 B2 | 2/2007 | Homma et al. |
| 7,194,766 B2 | 3/2007 | Noehring et al. |
| 7,263,006 B2 | 8/2007 | Aritome |
| 7,283,629 B2 | 10/2007 | Kaler et al. |
| 7,305,548 B2 | 12/2007 | Pierce et al. |
| 7,330,954 B2 | 2/2008 | Nangle |
| 7,372,962 B2 | 5/2008 | Fujimoto et al. |
| 7,386,662 B1 | 6/2008 | Kekre et al. |
| 7,415,549 B2 | 8/2008 | Vemula et al. |
| 7,424,553 B1 | 9/2008 | Borrelli et al. |
| 7,430,650 B1 | 9/2008 | Ross |
| 7,490,177 B2 | 2/2009 | Kao |
| 7,500,063 B2 | 3/2009 | Zohar et al. |
| 7,506,098 B2 | 3/2009 | Arcedera et al. |
| 7,613,876 B2 | 11/2009 | Bruce et al. |
| 7,620,748 B1 | 11/2009 | Bruce et al. |
| 7,624,239 B2 | 11/2009 | Bennett et al. |
| 7,636,801 B1 | 12/2009 | Kekre et al. |
| 7,660,941 B2 | 2/2010 | Lee et al. |
| 7,676,640 B2 | 3/2010 | Chow |
| 7,681,188 B1 | 3/2010 | Tirumalai et al. |
| 7,716,389 B1 | 5/2010 | Bruce et al. |
| 7,729,370 B1 | 6/2010 | Orcine et al. |
| 7,743,202 B2 | 6/2010 | Tsai et al. |
| 7,765,359 B2 | 7/2010 | Kang et al. |
| 7,877,639 B2 | 1/2011 | Hoang |
| 7,913,073 B2 | 3/2011 | Choi |
| 7,921,237 B1 | 4/2011 | Holland et al. |
| 7,934,052 B2 | 4/2011 | Prins et al. |
| 8,010,740 B2 | 8/2011 | Arcedera et al. |
| 8,032,700 B2 | 10/2011 | Bruce et al. |
| 8,156,320 B2 | 4/2012 | Borras |
| 8,161,223 B1 | 4/2012 | Chamseddine et al. |
| 8,165,301 B1 | 4/2012 | Bruce et al. |
| 8,200,879 B1 | 6/2012 | Falik et al. |
| 8,341,311 B1 | 12/2012 | Szewerenko et al. |
| 8,375,257 B2 | 2/2013 | Hong et al. |
| 8,447,908 B2 | 5/2013 | Bruce et al. |
| 8,510,631 B2 | 8/2013 | Wu et al. |
| 8,560,804 B2 | 10/2013 | Bruce et al. |
| 8,707,134 B2 | 4/2014 | Takahashi et al. |
| 8,713,417 B2 | 4/2014 | Jo |
| 8,788,725 B2 | 7/2014 | Bruce et al. |
| 8,959,307 B1 | 2/2015 | Bruce et al. |
| 9,043,669 B1 | 5/2015 | Bruce et al. |
| 9,099,187 B2 | 8/2015 | Bruce et al. |
| 9,135,190 B1 | 9/2015 | Bruce et al. |
| 9,147,500 B2 | 9/2015 | Kim et al. |
| 2001/0010066 A1 | 7/2001 | Chin et al. |
| 2002/0044486 A1 | 4/2002 | Chan et al. |
| 2002/0073324 A1 | 6/2002 | Hsu et al. |
| 2002/0083262 A1 | 6/2002 | Fukuzumi |
| 2002/0083264 A1 | 6/2002 | Coulson |
| 2002/0141244 A1 | 10/2002 | Bruce et al. |
| 2003/0023817 A1 | 1/2003 | Rowlands et al. |
| 2003/0065836 A1 | 4/2003 | Pecone |
| 2003/0120864 A1 | 6/2003 | Lee et al. |
| 2003/0131201 A1 | 7/2003 | Khare et al. |
| 2003/0163624 A1 | 8/2003 | Matsui et al. |
| 2003/0163647 A1 | 8/2003 | Cameron et al. |
| 2003/0163649 A1 | 8/2003 | Kapur et al. |
| 2003/0182576 A1 | 9/2003 | Morlang et al. |
| 2003/0204675 A1 | 10/2003 | Dover et al. |
| 2003/0223585 A1 | 12/2003 | Tardo et al. |
| 2004/0073721 A1 | 4/2004 | Goff et al. |
| 2004/0128553 A1 | 7/2004 | Buer et al. |
| 2005/0050245 A1 | 3/2005 | Miller et al. |
| 2005/0120146 A1 | 6/2005 | Chen et al. |
| 2005/0210149 A1 | 9/2005 | Kimball |
| 2005/0243610 A1 | 11/2005 | Guha et al. |
| 2005/0289361 A1 | 12/2005 | Sutardja |
| 2006/0004957 A1 | 1/2006 | Hand, III et al. |
| 2006/0031450 A1 | 2/2006 | Unrau et al. |
| 2006/0095709 A1 | 5/2006 | Achiwa |
| 2006/0112251 A1 | 5/2006 | Karr et al. |
| 2006/0184723 A1 | 8/2006 | Sinclair et al. |
| 2007/0019573 A1 | 1/2007 | Nishimura |
| 2007/0028040 A1 | 2/2007 | Sinclair |
| 2007/0058478 A1* | 3/2007 | Murayama ............ G11C 7/1051 365/233.12 |

(56) References Cited

U.S. PATENT DOCUMENTS

| | | |
|---|---|---|
| 2007/0073922 A1 | 3/2007 | Go et al. |
| 2007/0083680 A1 | 4/2007 | King et al. |
| 2007/0088864 A1 | 4/2007 | Foster |
| 2007/0094450 A1 | 4/2007 | VanderWiel |
| 2007/0096785 A1* | 5/2007 | Maeda .................. H03L 7/0805 327/158 |
| 2007/0121499 A1 | 5/2007 | Pal et al. |
| 2007/0130439 A1 | 6/2007 | Andersson et al. |
| 2007/0159885 A1 | 7/2007 | Gorobets |
| 2007/0168754 A1 | 7/2007 | Zohar et al. |
| 2007/0174493 A1 | 7/2007 | Irish et al. |
| 2007/0174506 A1 | 7/2007 | Tsuruta |
| 2007/0195957 A1 | 8/2007 | Arulambalam et al. |
| 2007/0288686 A1 | 12/2007 | Arcedera et al. |
| 2007/0288692 A1 | 12/2007 | Bruce et al. |
| 2008/0052456 A1 | 2/2008 | Ash et al. |
| 2008/0072031 A1 | 3/2008 | Choi |
| 2008/0147963 A1 | 6/2008 | Tsai et al. |
| 2008/0189466 A1 | 8/2008 | Hemmi |
| 2008/0218230 A1* | 9/2008 | Shim .................... G11C 29/023 327/161 |
| 2008/0228959 A1 | 9/2008 | Wang |
| 2009/0055573 A1 | 2/2009 | Ito |
| 2009/0077306 A1 | 3/2009 | Arcedera et al. |
| 2009/0083022 A1 | 3/2009 | Nordin et al. |
| 2009/0094411 A1 | 4/2009 | Que |
| 2009/0158085 A1 | 6/2009 | Kern et al. |
| 2009/0172250 A1 | 7/2009 | Allen et al. |
| 2009/0172466 A1 | 7/2009 | Royer et al. |
| 2009/0240873 A1 | 9/2009 | Yu et al. |
| 2010/0058045 A1 | 3/2010 | Borras et al. |
| 2010/0095053 A1 | 4/2010 | Bruce et al. |
| 2010/0125695 A1 | 5/2010 | Wu et al. |
| 2010/0250806 A1 | 9/2010 | Devilla et al. |
| 2011/0022778 A1 | 1/2011 | Schibilla et al. |
| 2011/0022801 A1 | 1/2011 | Flynn |
| 2011/0087833 A1 | 4/2011 | Jones |
| 2011/0093648 A1 | 4/2011 | Belluomini et al. |
| 2011/0113186 A1 | 5/2011 | Bruce et al. |
| 2011/0145479 A1 | 6/2011 | Talagala et al. |
| 2011/0161568 A1 | 6/2011 | Bruce et al. |
| 2011/0167204 A1 | 7/2011 | Estakhri et al. |
| 2011/0197011 A1 | 8/2011 | Suzuki et al. |
| 2011/0202709 A1 | 8/2011 | Rychlik |
| 2011/0258405 A1 | 10/2011 | Asaki et al. |
| 2011/0264884 A1 | 10/2011 | Kim |
| 2011/0264949 A1 | 10/2011 | Ikeuchi et al. |
| 2011/0270979 A1 | 11/2011 | Schlansker et al. |
| 2012/0005405 A1 | 1/2012 | Wu et al. |
| 2012/0005410 A1 | 1/2012 | Ikeuchi |
| 2012/0017037 A1 | 1/2012 | Riddle et al. |
| 2012/0102263 A1 | 4/2012 | Aswadhati |
| 2012/0102268 A1 | 4/2012 | Smith et al. |
| 2012/0137050 A1 | 5/2012 | Wang et al. |
| 2012/0271967 A1 | 10/2012 | Hirschman |
| 2012/0311197 A1 | 12/2012 | Larson et al. |
| 2013/0094312 A1* | 4/2013 | Jang ........................ G11C 7/04 365/194 |
| 2013/0099838 A1* | 4/2013 | Kim ....................... G11C 7/222 327/158 |
| 2013/0111135 A1 | 5/2013 | Bell, Jr. et al. |
| 2013/0208546 A1* | 8/2013 | Kim ........................ G11C 8/18 365/189.02 |
| 2013/0212337 A1 | 8/2013 | Maruyama |
| 2013/0212349 A1 | 8/2013 | Maruyama |
| 2013/0246694 A1 | 9/2013 | Bruce et al. |
| 2013/0262750 A1 | 10/2013 | Yamasaki et al. |
| 2013/0282933 A1 | 10/2013 | Jokinen et al. |
| 2013/0304775 A1 | 11/2013 | Davis et al. |
| 2013/0339578 A1 | 12/2013 | Ohya et al. |
| 2013/0339582 A1 | 12/2013 | Olbrich et al. |
| 2013/0346672 A1 | 12/2013 | Sengupta et al. |
| 2014/0095803 A1 | 4/2014 | Kim et al. |
| 2014/0104949 A1 | 4/2014 | Bruce et al. |
| 2014/0108869 A1 | 4/2014 | Brewerton et al. |
| 2014/0189203 A1 | 7/2014 | Suzuki et al. |
| 2014/0258788 A1 | 9/2014 | Maruyama |
| 2014/0285211 A1 | 9/2014 | Raffinan |
| 2014/0331034 A1 | 11/2014 | Ponce et al. |
| 2015/0006766 A1 | 1/2015 | Ponce et al. |
| 2015/0012690 A1 | 1/2015 | Bruce et al. |
| 2015/0032937 A1 | 1/2015 | Salessi |
| 2015/0032938 A1 | 1/2015 | Salessi |
| 2015/0067243 A1 | 3/2015 | Salessi et al. |
| 2015/0149697 A1 | 5/2015 | Salessi et al. |
| 2015/0149706 A1 | 5/2015 | Salessi et al. |
| 2015/0153962 A1 | 6/2015 | Salessi et al. |
| 2015/0169021 A1 | 6/2015 | Salessi et al. |
| 2015/0261456 A1 | 9/2015 | Alcantara et al. |
| 2015/0261475 A1 | 9/2015 | Alcantara et al. |
| 2015/0261797 A1 | 9/2015 | Alcantara et al. |
| 2015/0370670 A1 | 12/2015 | Lu |
| 2015/0371684 A1 | 12/2015 | Mataya |
| 2015/0378932 A1 | 12/2015 | Souri et al. |
| 2016/0026402 A1 | 1/2016 | Alcantara et al. |
| 2016/0027521 A1 | 1/2016 | Lu |
| 2016/0041596 A1 | 2/2016 | Alcantara et al. |

FOREIGN PATENT DOCUMENTS

| | | |
|---|---|---|
| TW | 489308 | 6/2002 |
| TW | 200428219 A | 12/2004 |
| TW | 436689 | 12/2005 |
| TW | I420316 | 12/2013 |
| WO | WO 94/06210 | 3/1994 |
| WO | WO 98/38568 | 9/1998 |

OTHER PUBLICATIONS

JP2005142859 (A) English Translation, Jun. 2, 2005.*
Office Action for U.S. Appl. No. 13/475,878, mailed on Jun. 23, 2014.
Office Action for U.S. Appl. No. 13/253,912 mailed on Jul. 16, 2014.
Office Action for U.S. Appl. No. 12/876,113 mailed on Jul. 11, 2014.
Office Action for U.S. Appl. No. 12/270,626 mailed on Feb. 3, 2012.
Office Action for U.S. Appl. No. 12/270,626 mailed on Apr. 4, 2011.
Office Action for U.S. Appl. No. 12/270,626 mailed on Mar. 15, 2013.
Notice of Allowance/Allowability for U.S. Appl. No. 12/270,626 mailed on Oct. 3, 2014.
Advisory Action for U.S. Appl. No. 12/876,113 mailed on Oct. 16, 2014.
Office Action for U.S. Appl. No. 14/297,628 mailed on Jul. 17, 2015.
Office Action for U.S. Appl. No. 13/475,878 mailed on Dec. 4, 2014.
USPTO Notice of Allowability & attachment(s) mailed Jan. 7, 2013 for U.S. Appl. No. 12/876,247.
Office Action mailed Sep. 14, 2012 for U.S. Appl. No. 12/876,247.
Office Action mailed Feb. 1, 2012 for U.S. Appl. No. 12/876,247.
Notice of Allowance/Allowability mailed Mar. 31, 2015 for U.S. Appl. No. 13/475,878.
Office Action mailed May 22, 2015 for U.S. Appl. No. 13/253,912.
Office Action for U.S. Appl. No. 12/876,113 mailed on Mar. 13, 2014.
Advisory Action for U.S. Appl. No. 12/876,113 mailed on Sep. 6, 2013.
Office Action for U.S. Appl. No. 12/876,113 mailed on May 14, 2013.
Office Action for U.S. Appl. No. 12/876,113 mailed on Dec. 21, 2012.
Security Comes to SNMP: The New SNMPv3 Proposed Internet Standard, The Internet Protocol Journal, vol. 1, No. 3, Dec. 1998.
Notice of Allowability for U.S. Appl. No. 12/882,059 mailed on May 30, 2013.
Notice of Allowability for U.S. Appl. No. 12/882,059 mailed on Feb. 14, 2013.
Office Action for U.S. Appl. No. 12/882,059 mailed on May 11, 2012.
Notice of Allowability for U.S. Appl. No. 14/038,684 mailed on Aug. 1, 2014.
Office Action for U.S. Appl. No. 14/038,684 mailed on Mar. 17, 2014.

(56) References Cited

OTHER PUBLICATIONS

Notice of Allowance/Allowability for U.S. Appl. No. 13/890,229 mailed on Feb. 20, 2014.
Office Action for U.S. Appl. No. 13/890,229 mailed on Oct. 8, 2013.
Office Action for U.S. Appl. No. 12/876,113 mailed on Dec. 5, 2014.
Notice of Allowance/Allowabilty for U.S. Appl. No. 12/876,113 mailed on Jun. 22, 2015.
Office Action for U.S. Appl. No. 14/217,249 mailed on Apr. 23, 2015.
Office Action for U.S. Appl. No. 14/217,467 mailed on Apr. 27, 2015.
Office Action for U.S. Appl. No. 14/616,700 mailed on Apr. 30, 2015.
Office Action for U.S. Appl. No. 14/217,436 mailed on Sep. 11, 2015.
Office Action for U.S. Appl. No. 13/475,878 mailed on Jun. 23, 2014.
Office Action for U.S. Appl. No. 12/876,113 mailed on Oct. 16, 2014.
Notice of Allowance for U.S. Appl. No. 12/270,626 mailed Oct. 3, 2014.
Office Action for U.S. Appl. No. 12/270,626 mailed on May 23, 2014.
Office Action for U.S. Appl. No. 12/270,626 mailed on Dec. 18, 2013.
Office Action for U.S. Appl. No. 12/270,626 mailed on Aug. 23, 2012.
Office Action mailed Sep. 11, 2015 for U.S. Appl. No. 14/217,436.
Office Action mailed Sep. 24, 2015 for U.S. Appl. No. 14/217,334.
Office Action dated Sep. 18, 2015 for Taiwanese Patent Application No. 102144165.
Office Action mailed Sep. 29, 2015 for U.S. Appl. No. 14/217,316.
Office Action mailed Sep. 28, 2015 for U.S. Appl. No. 14/689,045.
Office Action mailed Dec. 5, 2014 for U.S. Appl. No. 14/038,684.
Office Action mailed Oct. 8, 2015 for U.S. Appl. No. 14/217,291.
Final Office Action mailed Nov. 19, 2015 for U.S. Appl. No. 14/217,249.
Final Office Action mailed Nov. 18, 2015 for U.S. Appl. No. 14/217,467.
Office Action mailed Nov. 25, 2015 for U.S. Appl. No. 14/217,041.
Office Action mailed Oct. 5, 2015 for Taiwanese Application No. 103105076.
Office Action mailed Nov. 19, 2015 for U.S. Appl. No. 14/217,249.
Office Action mailed Nov. 18, 2015 for U.S. Appl. No. 14/217,467.
Office Action mailed Dec. 4, 2015 for U.S. Appl. No. 14/616,700.
Office Action mailed Jun. 4, 2015 for U.S. Appl. No. 14/215,414.
Office Action mailed Dec. 15, 2015 for U.S. Appl. No. 13/253,912.
Office Action mailed Dec. 17, 2015 for U.S. Appl. No. 14/214,216.
Office Action mailed Dec. 17, 2015 for U.S. Appl. No. 14/215,414.
Office Action mailed Dec. 17, 2015 for U.S. Appl. No. 14/803,107.
Office Action mailed Jan. 15, 2016 for U.S. Appl. No. 14/866,946.
Office Action mailed Jan. 11, 2016 for U.S. Appl. No. 14/217,399.
Office Action mailed Jan. 15, 2016 for U.S. Appl. No. 14/216,937.
Notice of Allowance and Examiner-Initiated Interview Summary, mailed Jan. 29, 2016 for U.S. Appl. No. 14/297,628.
National Science Fountation, Award Abstract #1548968, SBIR Phase I: SSD In-Situ Processing, http://www.nsf.gov/awardsearch/showAward?AWD_ID=1548968 printed on Feb. 13, 2016.
Design-Reuse, NxGn Data Emerges from Stealth Mode to provide a paradigm shift in enterprise storage solution, http://www.design-reuse.com/news/35111/nxgn-data-intelligent-solutions.html, printed on Feb. 13, 2016.
Office Action for U.S. Appl. No. 14/217,365 dated Feb. 18, 2016.
Office Action for U.S. Appl. No. 14/217,365 dated Mar. 2, 2016.
Office Action for U.S. Appl. No. 14/690,305 dated Feb. 25, 2016.
Office Action for U.S. Appl. No. 14/217,436 dated Feb. 25, 2016.
Office Action for U.S. Appl. No. 14/217,316 dated Feb. 26, 2016.
Office Action for U.S. Appl. No. 14/215,414 dated Mar. 1, 2016.
Office Action for U.S. Appl. No. 14/616,700 dated Mar. 8, 2016.
Notice of allowance/allowability for U.S. Appl. No. 13/253,912 dated Mar. 21, 2016.
Notice of allowance/allowability for U.S. Appl. No. 14/803,107 dated Mar. 28, 2016.
Office Action for U.S. Appl. No. 14/217,334 dated Apr. 4, 2016.
Notice of allowance/allowability for U.S. Appl. No. 14/217,041 dated Apr. 11, 2016.
Office Action for U.S. Appl. No. 14/217,249 dated Apr. 21, 2016.
Notice of allowance/allowability for U.S. Appl. No. 14/217,467 dated Apr. 20, 2016.

\* cited by examiner

US 9,423,457 B2

SELF-TEST SOLUTION FOR DELAY LOCKED LOOPS

CROSS-REFERENCE(S) TO RELATED APPLICATIONS

This application claims the benefit of and priority to U.S. Provisional Application 61/785,256, filed 14 Mar. 2013. This U.S. Provisional Application 61/785,256 is hereby fully incorporated herein by reference.

BACKGROUND (1) Technical Field

The present invention relates to delay locked loop circuits (DLLs). More particularly, the present invention relates to self-test solutions for use with circuitry having two or more delay locked loops.

(2) Description of the Related Art

Increasing processing speeds on computers and other devices require memory and other circuitry to operate within strict timing requirements. Timing constraints are often small enough that the layout of the components, temperature, or both must be considered or compensated for within the circuitry. Accordingly, DDR memory controllers and other circuits use DLLs to maintain specific timing requirements. Circuitry in the DLL uses a feedback loop in an attempt to find the frequency of the incoming periodic signal. Variable delay buffers in the DLL are adjusted until the output signal matches or locks onto the incoming signal. Once locked, the DLL may provide a variety of clock-control related services including phase/delay control, frequency multiplication, and frequency division.

Configurable DLLs may provide these different delays within a circuit to accommodate different design requirements. In particular, a DLL may introduce different delays to either advance or retreat a clock signal and fine tune the timing in a given circuit. For example, this may be useful for memory controllers and other circuitry with multiple timing modalities and features like 'overclocking'. In these situations, the reliability of the DLL has even greater importance as the timing requirements are not fixed but dynamic and changing.

Unfortunately, DLLs that do not work properly may introduce timing problems in the circuitry that are hard to troubleshoot. For example, faulty DLLs in a DDR memory controller may cause intermittent timing problems in the memory that are difficult to reproduce. Indeed, DLLs with more serious defects may even contribute to the outright failure of a DDR memory controller or other circuitry. Consequently, a solution is needed for testing the operation of these DLLs.

SUMMARY

Aspects of the present invention provide methods and systems for testing delay locked loops (DLLs) using built-in self test (BIST) circuitry and related software. In one embodiment, the BIST circuitry may be used to test two or more DLLs. The BIST circuitry utilizes a first DLL having a first delay input, a first clock input disposed to receive a clock input signal, and a first clock output that provides a first clock output signal delayed in comparison with the clock input signal. A second DLL used by the BIST circuitry has a second delay input, a second clock input disposed to receive the clock input signal, and a second clock output that provides a second clock output signal delayed in comparison with the clock input signal. The BIST circuitry incorporates a test controller that provides a first delay amount over the first delay input of the first DLL to create a start offset between the first clock output signal and the second clock output signal. The test controller may further provide a common delay amount to both the first delay input of the first DLL and the second delay input of the second DLL to introduce an additional delay in both the first clock output signal and the second clock output signal. The start offset should remain unchanged if the first DLL is functioning properly as the common delay amount provided should cause the first DLL to delay first clock output signal by approximately the same delay amount as the second clock output signal from the second DLL. Accordingly, a sample component creates a test dataset by sampling the second clock output signal from the second DLL during at least one edge of the first clock output signal from the first DLL. Next, a compare component performs a comparison of the test dataset with a comparison dataset and produces a comparison result to determine if the start offset has been maintained and the first DLL is operating properly.

Another embodiment of the present invention includes a BIST method for testing two or more DLLs used in a circuit. The BIST method includes providing a clock input signal to both a first DLL and a second DLL, wherein the clock input signal delayed by the first DLL corresponds to a first clock output signal and the clock input signal delayed by the second DLL corresponds to a second clock output signal. The BIST method further initializes the first DLL with a first delay amount causing the first clock output signal from the first DLL to become offset from the second clock output signal of the second DLL by a start offset. Additionally, the BIST method may modify both the first delay amount provided to the first DLL and a second delay amount provided to the second DLL by a common delay amount. The start offset should remain unchanged if the first DLL is functioning properly as the common delay amount should delay the first clock output signal by approximately the same delay amount as the second clock output signal from the second DLL. Accordingly, the BIST method determines if modifying both the first delay amount to the first DLL and the second delay amount to the second DLL by the common delay amount causes a change in the offset between the second clock output signal and the first clock output signal. The BIST method indicates that the first DLL may not be functioning properly when the method determines that the start offset set initially between the first clock output signal and the second clock output signal has changed in response to modifying both the first delay amount and the second delay amount by the common delay amount.

DETAILED DESCRIPTION OF THE INVENTION

In the following detailed description, for purposes of explanation, numerous specific details are set forth to provide a thorough understanding of the various embodiments of the present invention. Those of ordinary skill in the art will realize that these various embodiments of the present invention are illustrative only and are not intended to be limiting in any way. Other embodiments of the present invention will readily suggest themselves to such skilled persons having the benefit of this disclosure.

In addition, for clarity purposes, not all of the routine features of the embodiments described herein are shown or described. One of ordinary skill in the art would readily appreciate that in the development of any such actual implementation, numerous implementation-specific decisions may be required to achieve specific design objectives. These design objectives will vary from one implementation to another and from one developer to another. Moreover, it will be appreciated that such a development effort might be complex and time-consuming but would nevertheless be a routine engineering undertaking for those of ordinary skill in the art having the benefit of this disclosure.

Aspects of the present invention provide one or more of the following advantages. Instead of testing whether one DLL can provide a single delay, the DLL BIST of the present invention tests two or more DLLs operating through a range of different delays. Testing over a range of delays by the DLL BIST of the present invention particularly benefits circuitry that use DLLs to provide different timing delays. In addition, the DLL BIST of the present invention can identify faulty DLLs before they find their way into the field and a customer's application or system. It also may potentially help isolate the causes of a failed DLL during fabrication and improve overall yields. In one embodiment of the present DLLs are tested directly rather than indirectly through a data path portion of the circuitry. This feature enables the present invention to be used in many existing circuits without requiring significant modification.

In one example implementation, the DLLs being tested are incorporated as part of the DLL BIST of the present invention to perform a portion of the actual testing. At a minimum, two DLLs are required for one implementation of the DLL BIST, however alternate designs can be adapted for use with more than two DLLs. The DLL BIST may also work with an even or odd number of DLLs in a circuit.

Figure 1A:
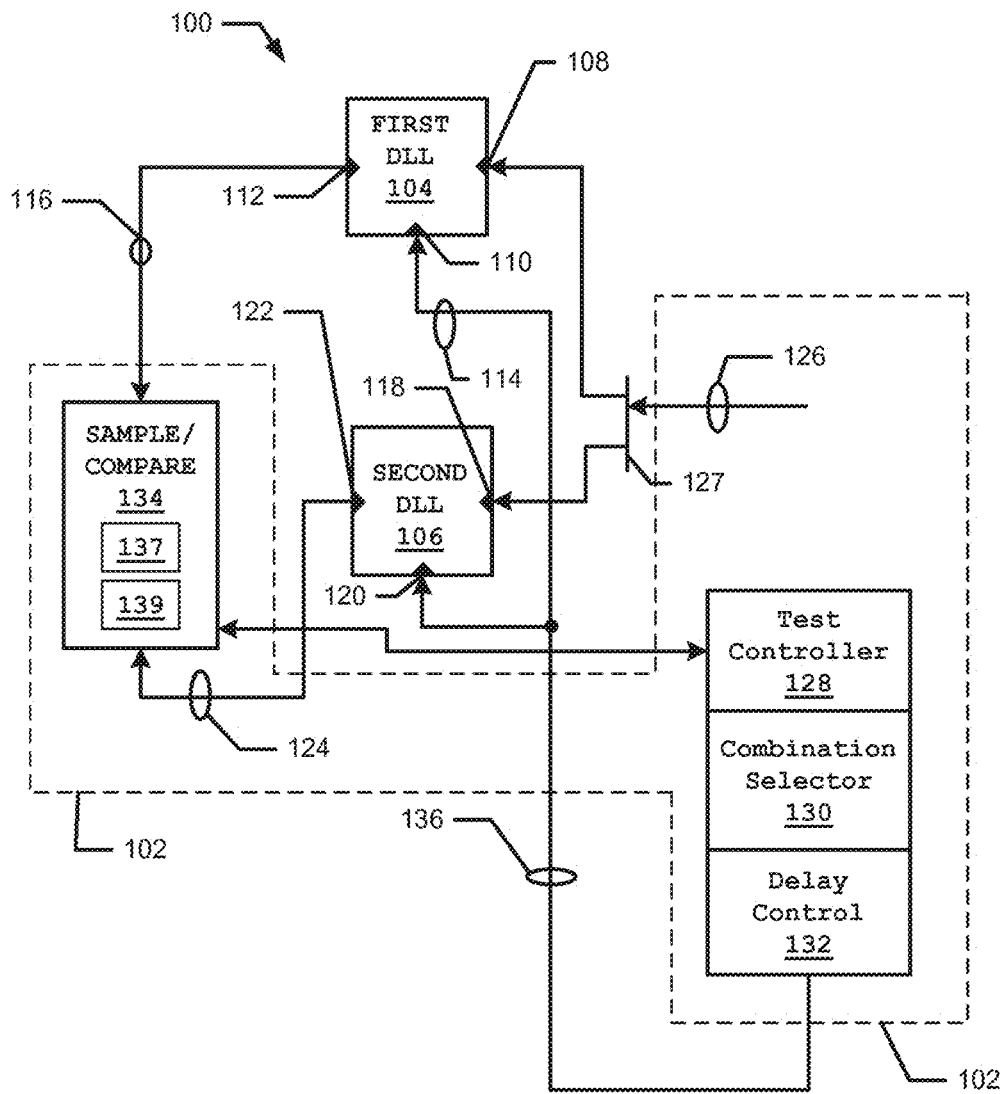
FIG. 1A is block diagram illustrating a delay locked loop built-in self-test (DLL BIST) system for use in circuitry having two delay locked loops (DLLs) in accordance with one embodiment of the present invention.

FIG. 1A illustrates circuitry having two DLLs and a DLL BIST designed in accordance with aspects of the present invention. In this implementation, circuitry 100 includes a first DLL 104, a second DLL 106 and DLL BIST 102. First DLL 104 includes a first delay input 110, a first clock input 108, and a first clock output 112. Likewise, second DLL 106 includes a second delay input 120, a second clock input 118 and a second clock output 122. A clock input signal 126 supplied to a fan-out device 127 distributes the clock input signal 126 to both the first clock input 108 and the second clock input 118 associated with the first DLL 104 and second DLL 106 respectively. DLL BIST 102 includes a test controller 128, a combination selector 130, a delay control 132 and a sample/compare component 134 that incorporates a sample component 137 and a compare component 139 in accordance with one embodiment.

Test controller 128 includes logic for controlling the overall operation of DLL BIST 102. During the operation of DLL BIST 102, test controller 128 instructs combination selector 130 to select a pair of DLLs in circuitry 100 to be used during testing. For example, if first DLL 104 is being tested, one implementation uses the first DLL 104 as a test DLL and the second DLL 106 as a comparison DLL to be compared with the test DLL in accordance with the present invention. In alternate embodiments, test controller 128 may use the second DLL 106 as the test DLL to be tested and the first DLL 104 to be compared with the test DLL.

Further, test controller 128 may instruct delay control 132 to provide different delay amounts to the test DLL and second DLL 106. These delay amounts may either increase the delay provided by a DLL or decrease the DLL provided by the DLL. In some implementations, a first delay amount 114 provided to the first delay input 110 of the test DLL creates an initial start offset amount between the first clock output signal 116 and the second clock output signal 124 by increasing a delay amount or decreasing a delay amount between the two signals. In one implementation, the start offset is created by providing the first delay amount 114 over the first delay input 110 and not providing a delay amount to the second clock input 118. For example, in one implementation the first delay amount 114 may be used to retard the first clock output signal 116 from the test DLL causing it to lag the second clock output signal 124 from the second DLL by the start offset amount. In an alternate implementation, the first delay amount 114 may be used to advance the first clock output signal 116 from the test DLL to lead the second clock output signal 124 from the second DLL by the start offset amount.

The test DLL is determined to be working properly in accordance with the present invention as long as the start offset remains substantially the same during the DLL testing operations. In accordance with the present invention, the first clock output signal 116 should continue to lag or lead the second clock output signal 124 by the start offset even when both signals are shifted in response to a common delay amount 136. Unlike the first delay amount 114, the common delay amount 136 is provided to both first delay input 110 and the second delay input 120 at the same time to determine if they are both operating in a similar manner. For example, the common delay amount 136 should cause both the first clock output signal 116 and the second clock output signal 124 to shift by the same amount if the test DLL is functioning properly.

Figure 1B:
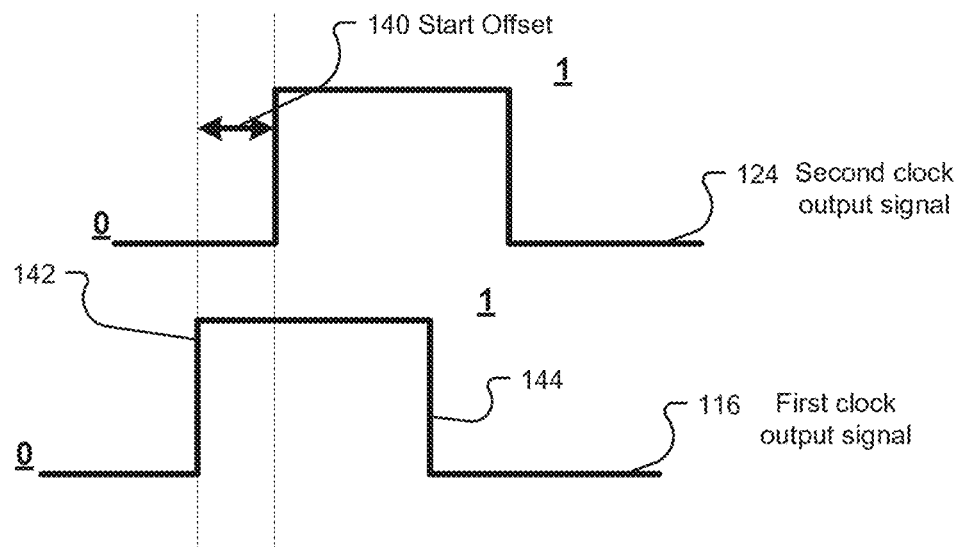
FIG. 1B is an example timing diagram of a first clock output signal from a test DLL leading a second clock output signal from a second DLL by a start offset in accordance with another embodiment of the present invention.
Figure 1C:
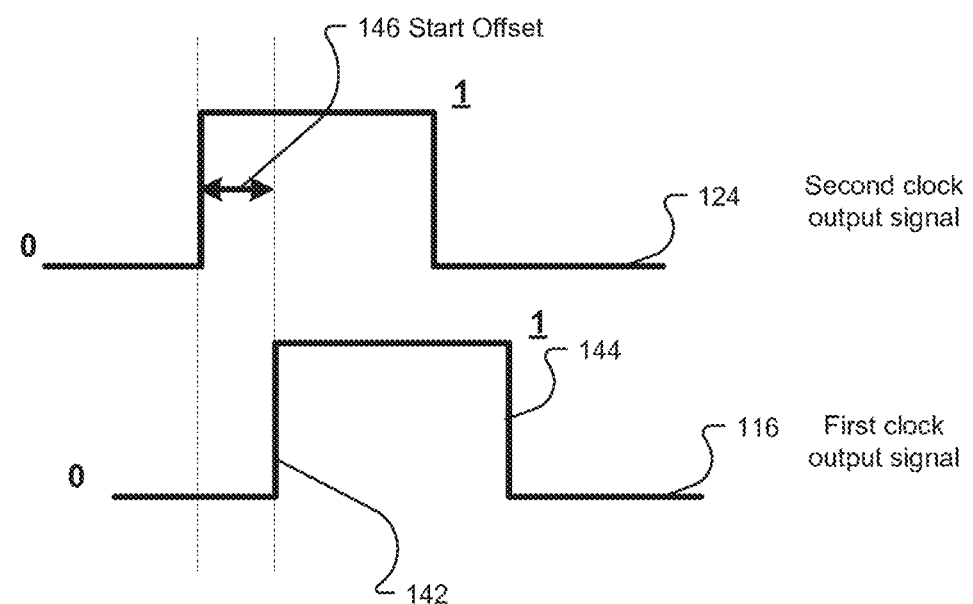
FIG. 1C is an example timing diagram of a first clock output signal from a test DLL lagging a second clock output signal from a second DLL by a start offset in accordance with yet another embodiment of the present invention.

Timing diagrams in FIGS. 1B and 1C respectively illustrate the shape of the first clock output signal leading and then lagging the second clock output signal in accordance with embodiments of the present invention. Test DLL used to produce first clock output signal 116 may be similar to first DLL 104 in FIG. 1A while second DLL may be similar to second DLL 106 also in FIG. 1A. Delay control 132 in FIG. 1A adjusts the delay of the test DLL until the first clock output signal 116 in FIG. 1B "leads" the second clock output signal 124 by the start offset 140. The first clock output signal 116 leads the second clock output signal 124 in FIG. 1B because the edges occur earlier in time compared with the edges associated with the second clock output signal 124. In some embodiments, the delay control 132 may establish the start offset 140 by iteratively increasing and decreasing the delay of the test DLL by various amounts until the start offset 140 is established. In the timing diagram in FIG. 1B, the first clock output signal 116 from the test DLL leads the second clock output signal 124 from the second DLL by a start offset 140. For example, delay control 132 may iteratively adjust the first delay amount 114 in FIG. 1A on the first delay input 110 to establish the start offset 140.

When the first clock output signal 116 from the test DLL leads by the start offset 140, a sample of the second clock output signal 124 from the second DLL 106 should have a binary "0" as the first clock output signal 116 from the test DLL is on a positive edge 142—a transition from a binary "0" to a binary "1". Likewise, a sample of the second clock output signal 124 from the second DLL should have a binary "1" when the first clock output signal 116 from the test DLL is on a negative edge 144—a transition from a binary "1" to a binary "0". Accordingly, a comparison dataset with binary "10" is used for testing when the first clock output signal 116 from the test DLL is initialized to lead the second clock output signal 124 by the start offset 140 as illustrated in FIG. 1B.

Alternatively, FIG. 1C illustrates the first clock output signal 116 from the test DLL initialized to lag the second clock output signal 124 from the second DLL by a start offset 146. The first clock output signal 116 lags the second clock output signal 124 in FIG. 1C because the edges occur later in time compared with the edges associated with the second clock output signal 124. Delay control 132 in FIG. 1A may adjust the delay of the test DLL until the first clock output signal 116 "lags" the second clock output signal 124 by the start offset 146 as illustrated in FIG. 1C. As previously described with respect to start offset 140, delay control 132 may likewise establish the start offset 146 by iteratively increasing and decreasing the delay of the test DLL by various amounts until the start offset 146 is established. For example, the delay control 132 may provide the first delay amount 114 in FIG. 1A on the first delay input 110 to establish the start offset 146.

When the first clock output signal 116 from the test DLL lags by the start offset 146, a sample of the second clock output signal 124 from a second DLL 106 has a binary "1" when the first clock output signal 116 from the test DLL is on a positive edge 142—a transition from a binary "0" to a binary "1". Likewise, a sample of the second clock output signal 124 from the second DLL has a binary "0" when the first clock output signal 116 from the test DLL is on a negative edge 144—a transition from a binary "1" to a binary "0". In this case, the comparison dataset holds a binary "01" when the first clock output signal 116 from the test DLL initially leads the reference clock output signal 124 by the start offset 146. The comparison dataset used during testing holds a binary "01" since the first clock output signal 116 from the test DLL initially lags the reference clock output signal 124 by the start offset 146.

After establishing either start offset 140 or start offset 146, delay control 132 further provides at least one common delay amount 136 as illustrated in FIG. 1A to both the first delay input 110 of the test DLL and the second delay input 120 of the second DLL 106. As previously described, the common delay amount 136 should cause both the test DLL and the second DLL 106 to modify the delay of the first clock output signal 116 and the second clock output signal 124 respectively by substantially the same amount of delay. For example, the common delay amount 136 should introduce the same amount of delay in both DLLs provided the test DLL or first DLL 104 and second DLL 106 have substantially the same operating characteristics. If the test DLL is functioning properly, delay control 132 may provide one or multiple different common delay amounts 136 and the start offset measured between the first clock output signal 116 and the second clock output signal 124 should not change. Testing may further include using multiple different common delay amounts 136 to determine if the test DLL functions properly over a range of different delays. For example, a test may include using a range of phase change from 0 to 360 degrees to determine if the test DLL can operate over a range of different delays and not just one common delay amount 136.

Sample component 137 from sample/compare component 134 in FIG. 1A creates a test dataset by sampling the second clock output signal 124 from the second DLL 106. Generally, the sample component 137 samples the second clock output signal 124 during at least one edge of the first clock output signal 116 from the test DLL. In one implementation, the sample component 137 takes a first sample from the second clock output signal 124 during a positive edge from the first clock output signal 116 and a second sample from the second clock output signal 124 during a negative edge from the first clock output signal 116. For example, the first sample may be taken when the second clock output signal 124 is a binary "1" and the second sample when the second clock output signal 124 is a binary "0". Accordingly, one test dataset incorporating both the first sample and second sample may be a binary "01". Example test datasets created during operation of a DLL BIST are described in further detail later herein in conjunction with FIG. 4A and FIG. 4B.

The compare component 139 from sample/compare component 134 uses the test dataset and a comparison dataset to determine whether the test DLL is functioning properly. The comparison dataset has the data expected when comparing the first clock output signal 116 from the test DLL with the second clock output signal 124 from the second DLL in accordance with the present invention. For example, the comparison dataset used for testing may be a binary "10" when the first clock output signal 116 from the test DLL (first DLL 104) is initialized to lead the second clock output signal 124 as illustrated in FIG. 1B. In another example, the comparison dataset used for testing may be a binary "01" when the first clock output signal 116 from the test DLL (first DLL 104) is initialized to lag the second clock output signal 124 as illustrated in FIG. 1C Compare component 139 performs a comparison between the test dataset and a comparison dataset and produces a comparison result to determine if the DLL is functioning correctly. If the test DLL is functioning properly, the comparison result should indicate that the comparison dataset matches the test dataset. However, the comparison dataset may not match the test dataset if the test DLL is not functioning properly. For example, the comparison result may indicate the test DLL is not functioning properly if the test dataset is a binary "10" and the comparison dataset is a binary "01".

DLL BIST 102 may be incorporated in a variety of circuitry using two or more DLLs and is not limited to the circuit design illustrated in FIG. 1A. Indeed, DLL BIST 102 may be incorporated in a double-data rate (DDR) memory controller, a quad-data rate (QDR) memory interface, a clock skew compensation circuit, a frequency multiplication circuit, a frequency division circuit or other circuit designs using at least two DLLs. In each of these and other circuits, the DLL BIST 102 of the present invention may be adapted to test more than the two DLLs illustrated in FIG. 1A.

Figure 2:
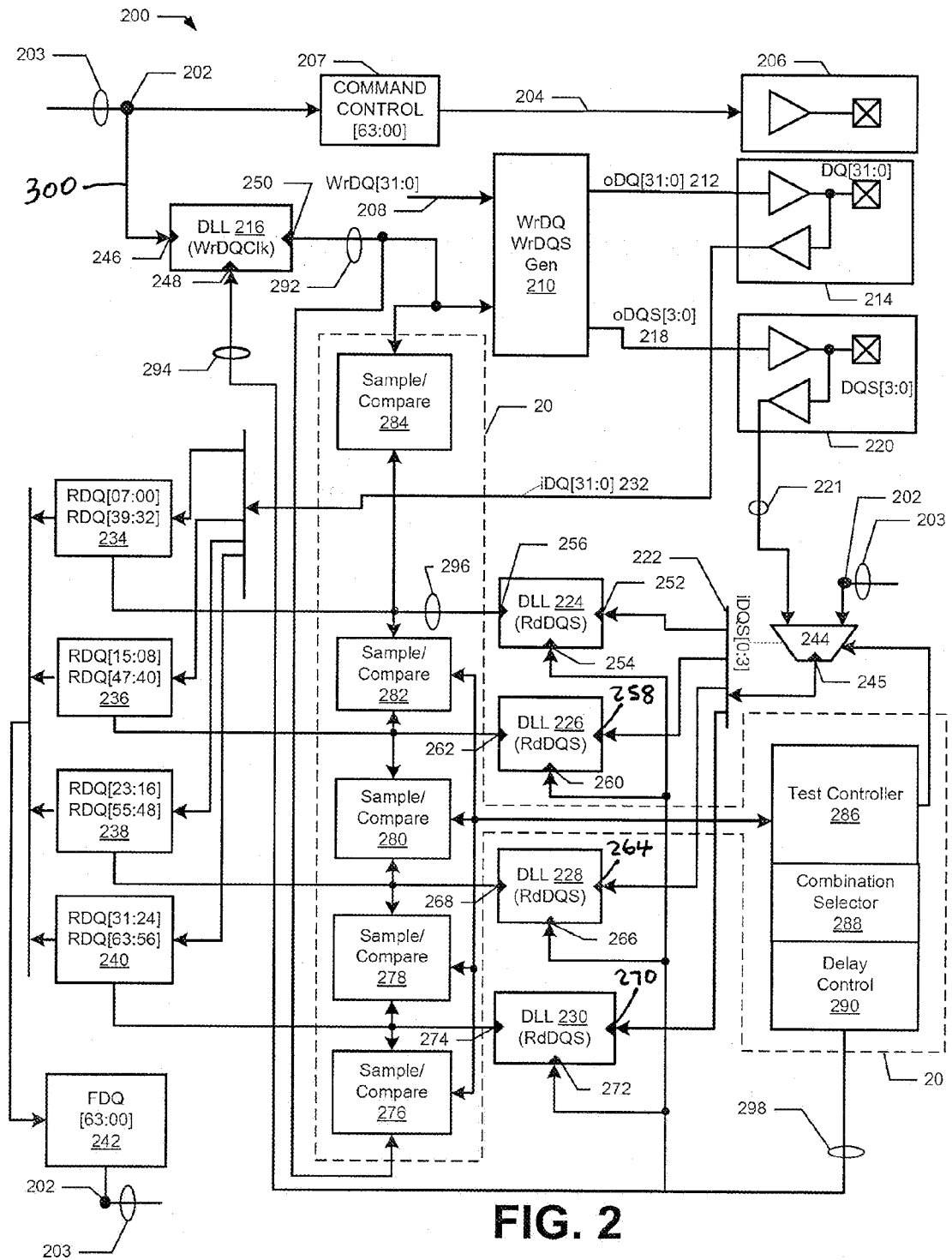
FIG. 2 is block diagram illustrating a DDR memory controller implementing five DLLs and a DLL BIST for testing the DLLs in accordance with a further embodiment of the present invention.

FIG. 2 illustrates a DLL BIST 20 of the present invention configured for testing five DLLs used in a DDR memory controller 200 in accordance with another embodiment of the present invention. DLL BIST 20 is similar to DLL BIST 102 in FIG. 1A except that it is configured to test five DLLs instead of two DLLs. For example, DLL BIST 20 of the present invention operates to test DLL 216, DLL 224, DLL 226, DLL 228 and DLL 230. Accordingly, in this example DLL 216 includes a clock input 246, a delay input 248 and a clock output 250; DLL 224 includes a clock input 252, a delay input 254 and a clock output 256; DLL 226 includes a clock input 258, a delay input 260 and a clock output 262; DLL 228 includes a clock input 264, a delay input 266 and a clock output 268 and DLL 230 includes a clock input 270, a delay input 272 and a clock output 274. Although DLLs 216, 224, 226, 228 and 230 each have the same form and function, further described below, this implementation example is not intended to be limiting in any way. Other types of DLLs may be used or mixed with different DLLs as long as these DLLs have respective inputs, outputs, and functions that are similar to those described herein.

DLL BIST 20 in FIG. 2 further includes a test controller 286, a combination selector 288, and a delay control 290 that operate in a similar manner as test controller 128, combination selector 130, and delay control 132 respectively in FIG. 1A. However, DLL BIST 20 uses multiple sample/compare components rather than just the one sample/compare component 134 as illustrated in FIG. 1A since more than two DLLs are being tested. In this example, DLL BIST 20 incorporates sample/compare component 284, sample/compare component 282, sample/compare component 280, sample/compare component 278 and sample/compare component 276 to facilitate the testing of DLL 216, DLL 224, DLL 226, DLL 228 and DLL 230. Each sample/compare component 276, 278, 280, 282 and 284 operates similar to sample/compare component 134 which includes sample component 137 and compare component 139 in FIG. 1A.

In addition, DLL BIST 20 uses demultiplexer 244 to switch between a core clock input signal 203 and a DQS (data queue strobe) signal 221, which are generated by DDR memory controller 200. During testing of the DLLs, test controller 286 causes demultiplexer 244 to route core clock input signal 203 to iDQS 222 via demultiplexer output 245. However, during normal operation of DDR memory controller 200 the test controller 286 instead causes demultiplexer 244 to route DQS signal 221 to iDQS 222. As part of the DDR memory controller's operation, DQS signal 221 passes through iDQS 222 and then use DLL 224, DLL 226, DLL 228, and DLL 230 to clock data from DQ (data queue) 214 into RDQ (read data queue), RDQ 236, RDQ 238, and RDQ 240 respectively.

Logic in test controller 286 controls the overall operation of DLL BIST 20. In the implementation illustrated in FIG. 2, test controller 286 instructs combination selector 288 to select two of the five DLLs from DDR memory controller 200 for testing. Combination selector 288 selects the DLLs and designates a first DLL as a test DLL and a second DLL. With respect to the DLL BIST 20, the first DLL and second DLL are used in similar manner as the first DLL 104 and second DLL 106 in FIG. 1A, except that DLL BIST 20 is testing more than two (2) DLLs, and hence the first DLL and second DLL may change. For example, the first DLL and second DLL may initially be associated with DLL 216 and DLL 224 during an initial phase of testing. During other portions of testing, combination selector 288 may associate the first DLL and second DLL with other pairs of DLLs, such as DLL 224 and DLL 226, DLL 226 and DLL 228, DLL 228 and DLL 230 or other combinations.

In one example, combination selector 288 may designate DLL 216 as the first DLL with clock input 246 as a first clock input, delay input 248 as a first delay input and clock output 250 as a first clock output. Similarly, combination selector 288 may designate DLL 224 as the second DLL with clock input 252 as a second clock input, delay input 254 as a second delay input and clock output 256 as a second clock output. Further, combination selector 288 may also select sample/compare component 284 to process signals from the first clock output (clock output 250) and second clock output (clock output 256).

During testing, test controller 286 also instructs demultiplexer 244 to route core clock input signal 203, instead of DQS signal 221, to iDQS 222 via demultiplexer output 245. This enables core clock input signal 203 to drive the selected DLLs during testing. Once testing with DDR BIST 20 of the present invention is complete, test controller 286 instructs demultiplexer 244 to route DQS signal 221 to iDQS 222 instead, which enables the resumption of data processing by DDR memory controller 200.

In one embodiment, the first DLL is also referred to as the test DLL since DLL BIST 20 compares the operation of the second DLL with the operation of the test DLL to determine if the test DLL is functioning properly. In this example, test controller 286 may instruct the delay control 290 to provide different delay amounts to the test DLL (DLL 216) and second DLL (DLL 224). In one implementation, the delay control 290 may be used to initially provide a first delay amount 294 over the first delay input (delay input 248) of the test DLL (DLL 216) creating a start offset between the first clock output signal 292 and the second clock output signal 296. For example, in one implementation the first delay amount 294 causes first clock output signal 292 from the test DLL (DLL 216) to lead the second clock output signal 296 from the second DLL (DLL 224) by the start offset amount, such as the start offset 140 in FIG. 1B. In an alternate implementation, the first delay amount 294 may cause the first clock output signal 292 from the test DLL (DLL 216) to lag the second clock output signal 296 from the second DLL (DLL 224) by another start offset amount, such as the start offset 146 in FIG. 1C.

Test controller 286 may also instruct delay control 290 in FIG. 2 to provide at least one common delay amount 298 to both the first delay input (delay input 248) of the test DLL (DLL 216) and the second delay input (delay input 254) of the second DLL (DLL 224). The common delay amount 298 causes both the test DLL (DLL 216) and the second DLL (DLL 224) to delay first clock output signal 292 and second clock output signal 296 by substantially the same amount of delay. For example, test DLL (DLL 216) and second DLL (DLL 224) should introduce substantially the same amount of delay in response to receiving the common delay amount 298 if they have the same overall operating characteristics.

Multiple different common delay amounts may be provided to determine if the test DLL (DLL 216) operates in a similar manner as the second DLL (DLL 224) over a range of delays. For example, the multiple different common delay amounts may cause a phase change in a DLL from 0 to 360 degrees of phase in 1 degree increments. If the test DLL (DLL 216) is functioning properly, the initial start offset between the first clock output signal 292 and the second clock output signal 296 should not change as delay control 290 provides one or multiple different common delay amounts 298. For example, the initial start offset may correspond to the start offset 140 in FIG. 1B or the start offset 146 in FIG. 1C depending if the first clock output signal 116 initially leads or lags the second clock output signal 124 respectively. In either case, the initial start offset between the first clock output signal 116 and second clock output signal 124 should remain the same during testing for properly functioning DLLs as both the first DLL and second DLL receive the same common delay amounts.

One of the five sample/compare components in DLL BIST 20 processes the first clock output signal 292 and second clock output signal 296 from the test DLL (DLL 216) and second DLL (DLL 224) respectively. In this example, sample/compare component 284 may be used to process the first clock output signal 292 from the test DLL (DLL 216) and the second clock output signal 296 from the second DLL (DLL 224). The sample component (not shown) in sample/compare component 284 creates a test dataset by sampling the second clock output signal 296 from the second DLL (DLL 224). This sample component creates the test dataset in a similar manner as sample component 137 in FIG. 1A.

The sample component samples the second clock output signal 296 from the second DLL (DLL 224) during at least one edge of the first clock output signal 292 from the test DLL (DLL 216). The shape of second clock output signal 296 and first clock output signal 292 are similar to the second clock output signal 124 and first clock output signal 116 in either FIG. 1B or FIG. 1C. Accordingly, in one implementation the sampling component takes a first sample from the second clock output signal 296 of the second DLL (DLL 224) during a positive edge from the first clock output signal 292 of the test DLL (DLL 216) similar to the positive edge 142 of first clock output signal 116 in FIG. 1C. For example, the first sample taken from the second clock output signal 296 at the positive edge of the first clock output signal 292 may be a binary "1". The sampling component may further take a second sample from the second clock output signal 296 of the second DLL (DLL 224) during a negative edge from the first clock output signal 292 of the test DLL (DLL 216) similar to the negative edge 144 of first clock output signal 116 in FIG. 1C. For example, the second sample taken from the second clock output signal 296 at the negative edge of the first clock output signal 292 may be a binary "0". Accordingly, one test dataset incorporating both the first sample and second sample may be a binary "01".

The compare component from sample/compare component 284 uses the test dataset and a comparison dataset to determine whether the test DLL (DLL 216) is functioning properly. Compare component (not shown) from sample/compare component 284 operates similar to the compare component 139 associated with sample/compare component 134 in FIG. 1A. The compare component performs a comparison between the previously created test dataset and a comparison dataset and produces a comparison result to make the determination. In one implementation, the comparison dataset may be a binary "01" or a binary "10" depending on the whether the first clock output signal 292 from the test DLL (DLL 216) initially lags or leads the second clock output signal 296 from the second DLL (DLL 224). As previously described, FIG. 1B illustrates signals associated with a comparison dataset of binary "10" as the first clock signal 116 leads the second clock signal 124. FIG. 1C illustrates signals associated with a comparison dataset of binary "01" as the first clock signal 116 lags the second clock signal 124. In either case, if the test DLL (DLL 216) is functioning properly, the comparison result should indicate that the comparison dataset matches the test dataset. However, the comparison result may indicate that the comparison dataset does not match the test dataset if the test DLL (DLL 216) is not functioning properly. For example, the compare component from sample/compare component 284 may indicate that the test DLL (DLL 216) is not functioning properly if the test dataset has a binary "10" and the comparison dataset has a binary "01".

Since DDR memory controller 200 circuitry in FIG. 2 has two or more DLLs, test controller 286 may need to repeat the testing with different DLL combinations. Accordingly, test controller 286 in FIG. 2 may further instruct combination selector 288 to continue the testing with different DLL pairs selected from DLLs 216, 224, 226, 228 and 230. Depending on the DLLs selected, test controller 286 may also use a different one of sample/compare components 284, 282, 280, 278 or 276 for testing. For example, combination selector 288 might select DLLs 216 and 224 and then DLLs 228 and 230 for testing using sample/compare component 284 and sample/compare component 278 respectively. Moreover, combination selector 288 may first designate DLL 216 as the test DLL and DLL 224 as the second DLL in one portion of a test and subsequently designate DLL 228 as the test DLL and DLL 230 as the second DLL in another portion of the test.

Logic in test controller 286 may further include a test sequence specifying the pairs of DLLs to be tested. The test sequence may assist in identifying one or several faulty DLLs especially in circuits having two or more DLLs. Each entry in the test sequence may at least specify a DLL to be used as the test DLL, and a DLL to be used as the second DLL. The exact number of entries in the test sequence may vary depending on the number of DLLs being tested and the desired scope of testing. For example, combination selector 288 may be instructed to use a test sequence with five (5) entries for testing different pairs of DLLs from memory controller 200 in FIG. 2. One test sequence for DLL 216, DLL 224, DLL 226, DLL 228 and DLL 230 in FIG. 2 may be as follows:

Example DLL Test Sequence:
1) SECOND DLL=DLL 216; TEST DLL=DLL 224
2) SECOND DLL=DLL 216; TEST DLL=DLL 226
3) SECOND DLL=DLL 216; TEST DLL=DLL 228
4) SECOND DLL=DLL 216; TEST DLL=DLL 230
5) SECOND DLL=DLL 224; TEST DLL=DLL 216

When the DLLs are not being tested, implementations of the present invention allow the underlying circuitry to function normally. Specifically, DLL BIST 20 of the present invention allows circuitry in FIG. 2 to operate as DDR memory controller 200. For example, test controller 286 may quiesce a portion of DLL BIST 20 by instructing demultiplexer 244 to pass DQS signal 221 from DQS 220 rather than from core clock input signal 203 as previously described.

Normal operation of DDR memory controller 200 also uses the same DLLs used by the DLL BIST 20 of the present invention. In the exemplary circuit in FIG. 2, DDR memory controller 200 may use DLL 216 as a write data queue clock DLL (WrDQClk DLL) 216 and DLLs 224, 226, 228 and 230 as Read Data Queue strobe DLLs (RdDQS DLLs) 224, 226, 228 and 230 respectively. DDR memory controller 200 further includes Write Data Queue/Write Data Queue Strobe Generator (WrDQ/WrDQS Gen) 210, command control 207, control 206, Data Queue (DQ) 214 and Data Queue Strobes (DQS) 220. DDR memory controller 200 further includes input data queues iDQS 222 and Read Data Queues (RDQ) 234, 236, 238 and 240. Full read data queue (FDQ) 242 combines the output from the RDQs 234, 236, 238, and 240 and presents a single result.

During operation of DDR memory controller 200, command control 207 sends one or more commands and addresses over control bus 204 in order to read or write data through DQ 214. In various implementations, commands issued may include RAS (row-address select), CAS (column address select), chip select (CS), write enable (WE) and others. Command control 207 may use these and other commands to set the address and store or fetch data through DQ 214. For example, command control 207 may use these commands and others to store or fetch data from a DRAM memory associated with DQ 214.

A processor or other data source provides data on write data queue (WrDQ) 208 to be processed in accordance with the DDR protocol. Depending on the version of DDR employed, WrDQ/WrDQS Gen 210 may queue one or more groups of data from WrDQ 208 to be written over output data queue (oDQ) 212 and DQ 214. For example, 64-bits of data may be transmitted from WrDQ 208 to DQ 214 in two groups of 32-bits. In one implementation, this data may be written by DDR memory controller 200 to 8 or 9 DRAMs located on multiple banks of DIMMs (not shown) in the memory slots of a system. The oDQ 212 operates to hold the data passing between WrDQ/WrDQS Gen 210 and DQ 214. Transitions in output data queue strobe (oDQS) 218 coordinate the clocking of the data into DQ 214 in accordance with the DDR protocol.

Data passing through WrDQ/WrDQS Gen 210 and oDQ 212 is generally clocked by oDQS 218 at the same or multiple frequencies of core clock input signal 203 provided over core clock input 202. Even higher throughput is made possible by processing oDQ 212 on both the positive and negative edges of the clock input signal 300 thus giving the data transmission double the data rate or DDR throughput. To write data to DQ 214, WrDQClk DLL 216 shifts the clock input signal 300 from core clock input 202 ninety (90) degrees and then provides to data queue strobe portion of the WrDQ/WrDQS Gen 210. This shift centers the core clock input signal 203 on the data window associated with oDQ 212 and oDQS 218 and maximizes the setup and hold time for the data.

In accordance with the DDR protocol, RdDQS DLLs 224, 226, 228 and 230 delay signals from iDQS 222 before they are provided to associated RDQs 234, 236, 238 and 240. As a result, the data queue strobes are aligned on the edges of the data window used to read data from DQ 214. In the implementation illustrated in FIG. 2, the RdDQS DLLs 224, 226, 228 and 230 may be configured to clock data from DQ 214 on the data window edges to RDQs 234, 236, 238 and 240. Alternate timing requirements could also be accommodated using other delay configurations from the DLLs, and thus the embodiment disclosed herein is not intended to limit the present invention in any way. Multiple RDQs 234, 236, 238 and 240 receive portions of data over input data queue (iDQ) 232 based on timing from iDQS 222 and the RdDQS DLLs 224, 226, 228 and 230. Eventually, FDQ 242 collects the results of the read operations as coordinated via timing from RdDQS DLLs 224, 226, 228 and 230.

Figure 3:
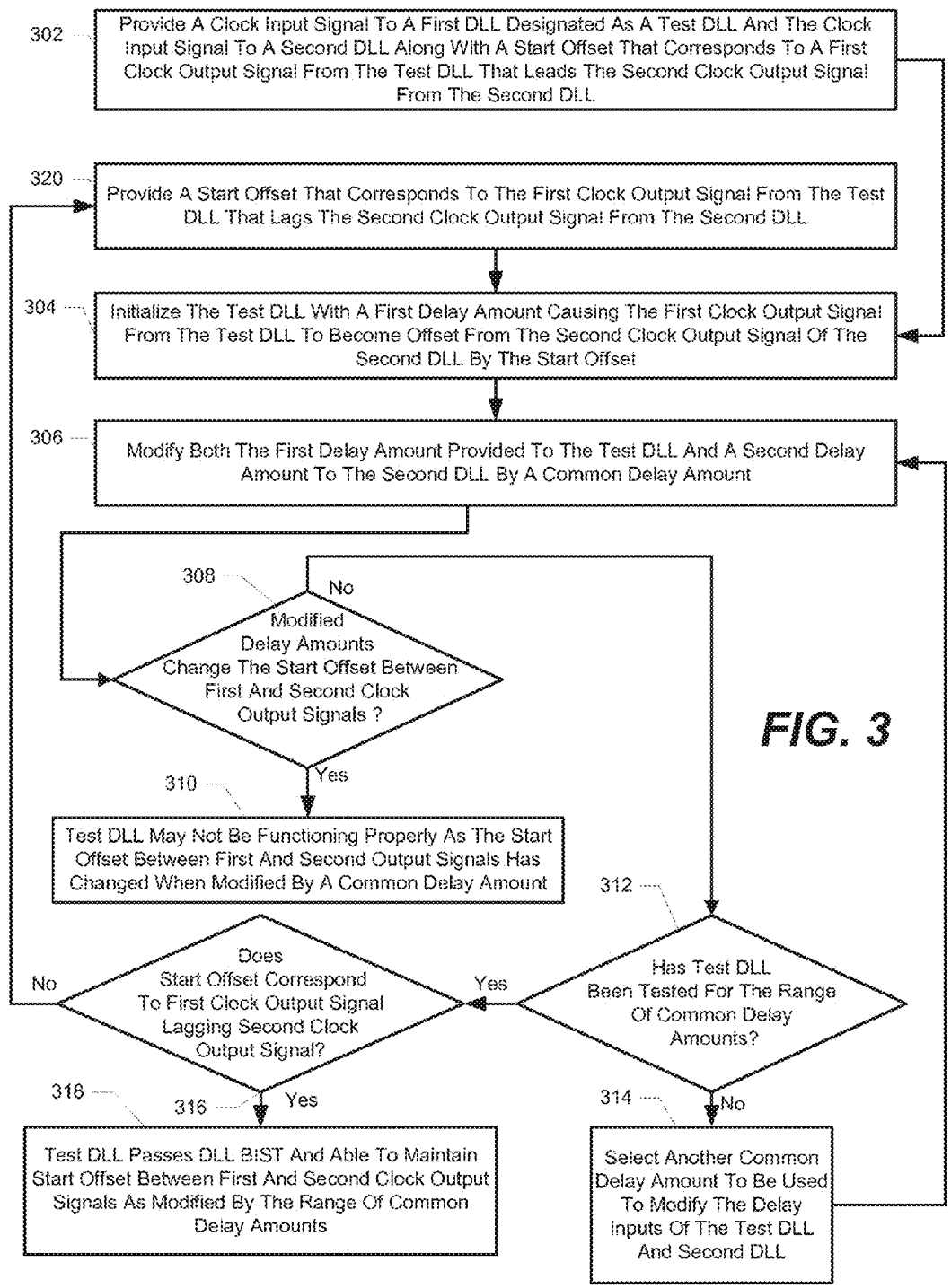
FIG. 3 is a flowchart diagram representing the operations associated with a DLL BIST designed in accordance with yet another embodiment of the present invention.

FIG. 3 is a flowchart representation of the operations for implementing a DLL BIST in accordance with one implementation of the present invention. Initially, aspects of the present invention provide a clock input signal to both a first DLL designated as a test DLL and a second DLL (302). A first clock output signal corresponds to the clock input signal delayed by the test DLL while a second clock output signal corresponds to the clock input signal delayed by the second DLL. A first delay amount provided to the test DLL determines the amount of delay the test DLL will use when generating the first clock output signal. Similarly, a second delay amount determines the amount of delay the second DLL will use when generating the second clock output signal.

A start offset provided corresponds to a first clock output signal from the test DLL leading the second clock output signal from the second DLL (302). In accordance with some implementations, the start offset determines the offset that should exist between the first clock output signal and the second clock output signal at the start of the testing. For example, the first clock output signal may lead the second clock output signal by the start offset in a first portion of the testing.

Aspects of the present invention next provide a first delay amount to the test DLL causing the first clock output signal from the test DLL to be offset from the second clock output signal of the second DLL by the start offset amount (304). In one implementation, the start offset provided corresponds to the first clock output signal leading the second clock output signal. For example, using the start offset provided in (302) above, implementations of the present invention provide a first delay amount to the test DLL that causes the first clock output signal to lead the second clock output signal. As illustrated by the timing diagram in FIG. 1B, the first delay amount changes the delay of the test DLL until the first clock output signal 116 leads the second clock output signal 124 from the second DLL by the start offset 140. A test dataset corresponding to the timing diagram in FIG. 1B contains binary "10" representing the first clock output signal leading the second clock output signal as illustrated. As previously described, the test dataset is compared with a comparison dataset and used in accordance with the present invention to determine if the test DLL is functioning properly.

Next, one implementation proceeds to determine whether the test DLL can delay input signals by different common delay amounts without error. To do this, aspects of the present invention modify both the first delay amount to the test DLL and a second delay amount to the second DLL by a common delay amount (306). The common delay amount is selected from a predetermined set of common delay amounts corresponding to an incremental delay and phase change ranging from 0 to 360 degrees. If the test DLL is functioning properly, the common delay amount should cause the test DLL to increase the delay of the first clock output signal by approximately the same amount as the second clock output signal from the second DLL.

Next, aspects of the present invention determine if the modified delay inputs provided to the test DLL and the second DLL have changed the start offset measured between the first clock output signal and the second clock output signal (308). If the test DLL is operating properly, the previously established start offset should remain the same throughout the testing as the test DLL and second DLL receive the same common delay amounts. Conversely, a change in the start offset indicates that the test DLL may not be working properly. To make this determination, one implementation compares the comparison dataset with a test dataset. If the test DLL is operating properly, the values in the comparison dataset match the test dataset. In one implementation, if the comparison dataset is set to binary "10" then the test dataset should also have a binary "10". As previously described and illustrated in FIG. 1B, the comparison dataset is set to binary "10" when the first clock output signal leads the second clock output signal by the start offset amount. In an alternate implementation, if the comparison dataset is set to binary "01" then the test dataset should also have a binary "01". FIG. 1C illustrates when the first clock output signal lags the second clock output signal by the start offset amount and is associated with a comparison dataset value of binary "01".

If the test DLL is determined to be functioning properly, the start offset between the first clock output signal and the second clock output signal should remain the same (308—No) and the testing continues. However, the start offset measured between the first clock output signal and the second clock output signal may change if the test DLL is faulty or failing (308-Yes). Implementations of the present invention indicate that the test DLL may not be functioning properly when the determination indicates that the start offset initially set between the first clock output signal and the second clock output signal has changed when modified by the common delay amount (310). For example, the test DLL may be identified as faulty when the corresponding comparison dataset does not match the test dataset as previously described. Essentially, the test DLL has failed to provide the expected delay in response to receiving a common delay amount also provided to the second DLL.

If the start offset remains unchanged, aspects of the present invention indicate that the test DLL appears to be operating properly for the provided common delay amount (308—No). In this case, the start offset is unchanged because both the test DLL and second DLL respond to the common delay amount with the same incremental delay. Likewise, the comparison dataset should match the test dataset sampled from the second clock output signal.

To complete the testing, a determination is made whether the test DLL has been tested for the range of common delay amounts (312). In one implementation, the set of common delay amounts relates to a set of delays and corresponding phase change ranging from 0 to 360 degrees. This is important as the DLL BIST of the present invention determines whether the test DLL can produce multiple different delays within a circuit. Accordingly, if there are more common delay amounts to test (312—No), aspects of the present invention may further select another common delay amount from a set of common delay amounts for both the test DLL and second DLL. For example, the set of common delay amounts may result in changing the phase of the first and second clock output signals over a range from 0 to 360 degrees. The selected common delay amount is used to modify the delay amount provided over the first and second delay inputs of the test DLL and second DLL respectively in accordance with aspects of the present invention (314).

Alternatively, if all common delay amounts have been tested, the test DLL is considered to have passed at least a first portion of testing with the DLL BIST of the present invention (312-Yes). In one implementation, the first portion of testing concerns the first clock output signal leading the second clock output signal. For example, in the first portion of testing the start offset corresponds to the first clock output signal leading the second clock output signal—similarly, the second portion of testing concerns whether the first clock output signal lags the second clock output signal (316-No).

If the first portion of testing is complete, aspects of the present invention next provides a start offset that corresponds to the first clock output signal from the test DLL lagging the second clock output signal from the second DLL (320). When this occurs, implementations of the present invention provide a first delay amount to the test DLL causing the first clock output signal to lag the second clock output signal as illustrated in the timing diagram of FIG. 1C. A test dataset corresponding to the timing diagram in FIG. 1C contains binary "01" and represents the first clock output signal 116 lagging the second clock output signal 124 as illustrated by start offset 142. As previously described, the test dataset is used to compare with a comparison dataset and, in accordance with the present invention, to determine if the test DLL is functioning properly.

The aforementioned steps 304, 306, 308, 310, 312, 314 and 316 are repeated in a similar manner as previously described except that the first clock output signal from the test DLL now lags, rather than leads, the second clock output signal from the second DLL by the start offset. The test DLL may pass the DLL BIST of the present invention if both portions of the test indicate the test DLL is able to maintain the start offset between the first clock output signal and second clock output signal as modified by the range of common delay amounts (318).

Figure 4A:
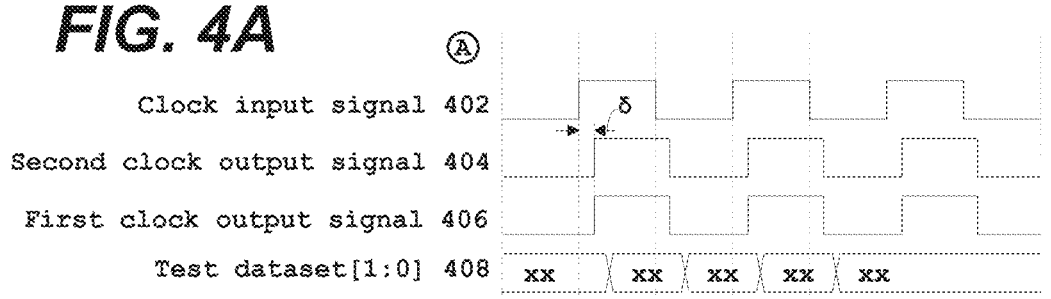
FIG. 4A illustrates detailed timing diagrams associated with a first clock output signal from a test DLL leading a second clock output signal from a second DLL in accordance with another embodiment of the present invention.
Figure 4A:
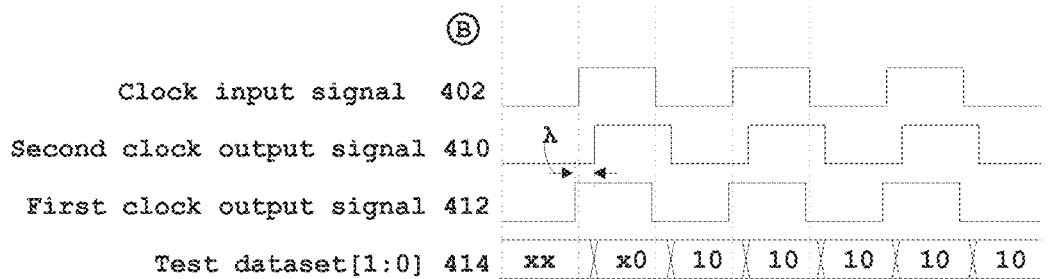
Figure 4A:
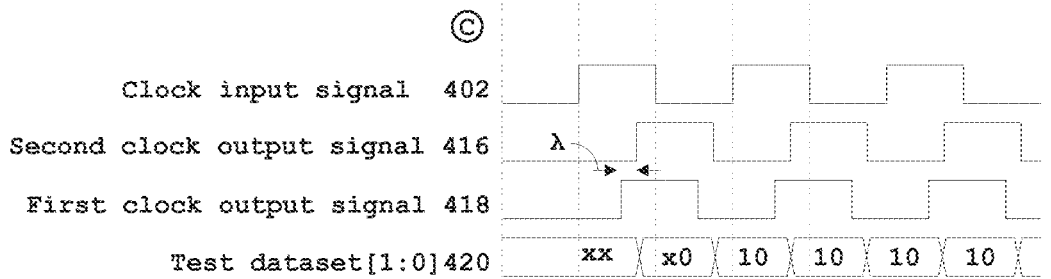
Figure 4A:
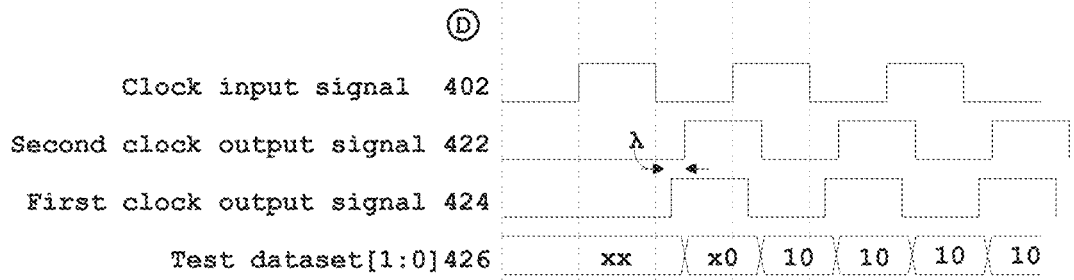
Figure 4A:
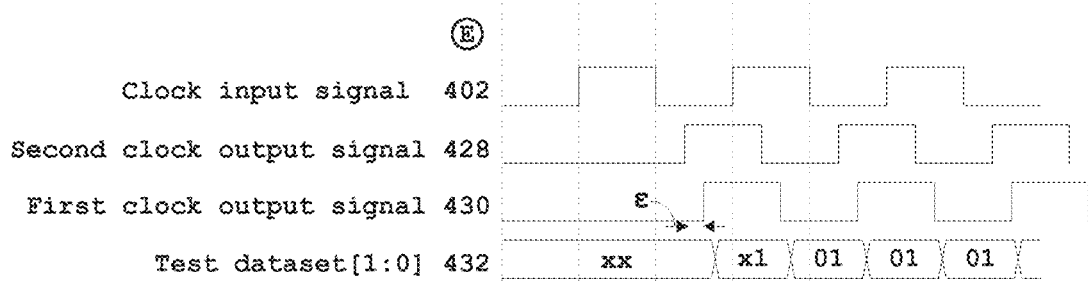
Figure 4B:
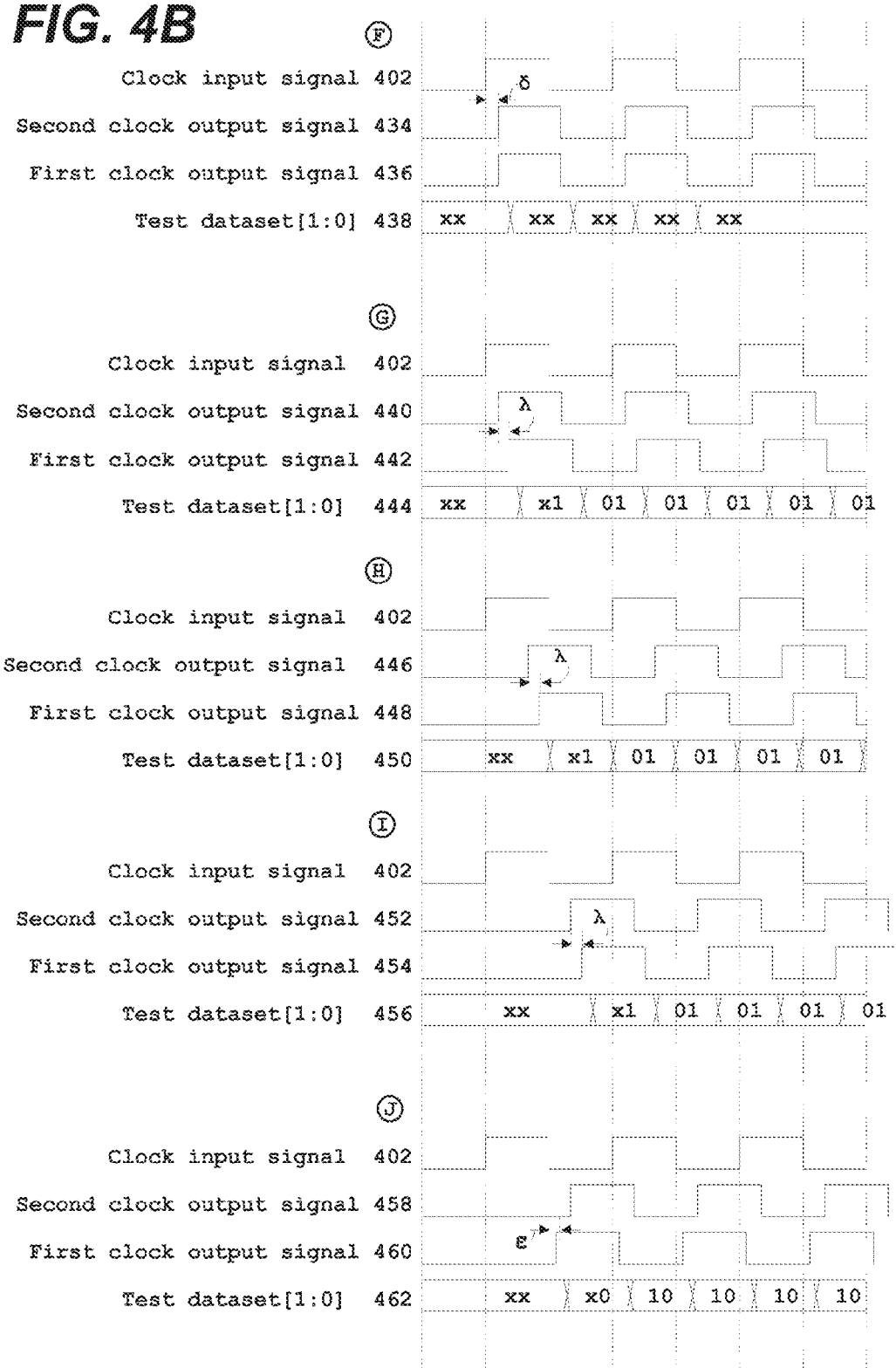
FIG. 4B illustrates detailed timing diagrams associated with a first clock output signal from a test DLL lagging a second clock output signal from a second DLL in accordance with yet another embodiment of the present invention.

Timing diagrams in FIGS. 4A and 4B illustrate the relationship between the clock input signal, the second clock output signal, the first clock output signal and the test dataset as used by a DLL BIST of the present invention. In particular, timing diagrams in FIG. 4A reflect initializing the first clock output signal from the test DLL such that it leads the second clock output signal from the second DLL by a start offset. For this first portion of the test depicted in FIG. 4A, the comparison dataset may be set to the binary "10" (not shown) reflecting that the first clock output signal initially leads the second clock output signal by the start offset amount. In comparison, timing diagrams in FIG. 4B reflect initializing the first clock output signal such that it lags the second clock output signal by the start offset. For this second portion of the test depicted in FIG. 4B, the comparison dataset may be set to binary "01" (not shown) reflecting that the first clock output signal initially lags the second clock output signal by the start offset amount.

Referring to FIG. 4A, timing diagram A reflects a preliminary state of the signals prior to initialization and includes clock input signal 402, second clock output signal 404 and first clock output signal 406. Test dataset 408 values identified as "XX" indicate that the test data may be available but not used. A small insertion delay ($\delta$) inherent to the circuit design separates clock input signal 402 from the two clock output signals as illustrated. Moreover, timing diagram A in FIG. 4A illustrates the first clock output signal 406 and second clock output signal 404 as in-phase however these two signals may begin out-of-phase and still work in accordance with the present invention.

Next, timing diagram B reflects initializing first clock output signal 412 to "leads" the second clock output signal 410 by a start offset or $\lambda$. In one implementation, aspects of the present invention decrease a first delay amount (not shown) to the test DLL until the first clock output signal 412 leads the second clock output signal 410 by the start offset or $\lambda$. The comparison dataset set to binary "10" reflects that the first clock output signal 412 was initialized to lead the second clock output signal 410 by the start offset or $\lambda$. Implementations of the present invention may sample second clock output signal 410 at the positive and negative edge of first clock output signal 412 and store in test dataset 414 for comparison with the comparison dataset.

Timing diagram C in FIG. 4A illustrates the result of providing a common delay amount (not shown) to the second delay input and first delay input of the second DLL and test DLL respectively. DLL BIST of the present invention determines whether both DLLs delay the clock output signals approximately the same amount when provided the common delay amounts. If the test DLL is functioning properly, the common delay amount provided to the test DLL should cause the test DLL to delay first clock output signal 418 by approximately the same delay amount the second DLL delays second clock output signal 416. Accordingly, first clock output signal 418 should maintain the start offset or $\lambda$ from the second clock output signal 416. In timing diagram C, the test DLL appears to be working properly as the start offset between the second clock output signal 416 and first clock output signal 418 remains equal to $\lambda$. This relationship is confirmed as the resulting binary "10" in test dataset 420 is the same as the binary "10" held by the comparison dataset during initialization.

Referring to timing diagram D, a range of common delay amounts (not shown) are provided over the second delay input and first delay input of the second DLL and test DLL respectively until a phase shift of 360 degrees and range of delays have been tested. As illustrated, the offset between the second clock output signal 422 and first clock output signal 424 continues to remain equal to start offset or λ indicating that the test DLL is functioning properly over the range of delays. Once again, this relationship is confirmed as the resulting binary "10" in test dataset 426 is the same as the binary "10" stored in the comparison dataset.

Timing diagram E illustrates how the DLL BIST of the present invention detects when a test DLL has problems delaying an input clock signal such as clock input signal 402. Unlike the previous examples, the test DLL and second DLL in timing diagram E do not delay clock input signal 402 the same delay amount even though both DLLs were initialized with the same start offset of λ and given the same common delay amounts. Specifically, it can be seen in the timing diagram E that the offset between the second clock output signal 428 and first clock output signal 430 is ε and no longer equal to the first start offset of λ. Indeed, first clock output signal 430 lags by ε instead of leading by λ. Consequently, the test DLL may be flagged as faulty in accordance with the present invention since the sampled binary value "01" in test dataset 432 is not the same as the binary "10" stored in the comparison dataset.

In comparison to FIG. 4A, detailed timing diagrams in FIG. 4B reflect initializing the first clock output signal such that it lags the second clock output signal by a start offset. Accordingly, timing diagram F in FIG. 4B reflects a preliminary state of the signals prior to initialization and includes clock input signal 402, second clock output signal 434 and first clock output signal 436. Once again, test dataset 438 values identified as "XX" indicate that the test data may be present but not used. A small insertion delay (δ) inherent to the circuit design separates clock input signal 402 from the two clock output signals as illustrated. Moreover, timing diagram F illustrates the second clock output signal 434 and first clock output signal 436 as in-phase however these two signals may begin out-of-phase and still work in accordance with the DLL BIST of the present invention.

Next, timing diagram G reflects initializing first clock output signal 442 to "lag" the second clock output signal 440 by the start offset or λ. In one implementation, aspects of the present invention increase a first delay amount (not shown) to the test DLL until the first clock output signal 442 lags the second clock output signal 440 by the start offset or λ. The comparison dataset (not shown) may be set to the binary "01" reflecting that the first clock output signal 442 was initialized to lag the second clock output signal 440 by a start offset or λ. Implementations of the present environment sample second clock output signal 440 at the positive and negative edge of first clock output signal 442. These samples taken from second clock output signal 440 are stored in test dataset 444 for comparison with the comparison dataset.

Timing diagram H in FIG. 4B illustrates the result of providing a common delay amount (not shown) to the second delay input and first delay input of the second DLL and test DLL respectively. DLL BIST of the present invention determines whether both DLLs delay the clock output signals approximately the same amount when provided the same common delay amounts. If the test DLL is functioning properly, the common delay amount provided to the test DLL should cause the test DLL to delay first clock output signal 448 by approximately the same increased delay amount as the second clock output signal 446. Accordingly, first clock output signal 448 should maintain the start offset or λ from the second clock output signal 446. In timing diagram H, the test DLL appears to be working properly as the start offset between the second clock output signal 446 and first clock output signal 448 remains equal to λ. This relationship is confirmed as the resulting binary "01" in test dataset 450 is the same as the binary "01" held by the comparison dataset.

Referring to timing diagram I, a range of common delay amounts (not shown) are provided over the second delay input and first delay input of the second DLL and test DLL respectively until a phase shift of 360 degrees and range of delays have been tested. The offset between the second clock output signal 452 and first clock output signal 454 continues to remain equal to the start offset or λ indicating that the test DLL is functioning properly over the range of delays. Once again, this relationship is confirmed as the resulting binary "01" in test dataset 456 is the same as the binary "01" stored in the comparison dataset.

Timing diagram J illustrates how the DLL BIST of the present invention detects when a test DLL has problems delaying an input clock signal such as clock input signal 402. Unlike the previous examples, the test DLL and second DLL in timing diagram J do not delay clock input signal 402 the same delay amount even though both DLLs were initialized with the same start offset of λ and given the same common delay amounts. Specifically, it can be seen in the timing diagram J that the offset between the second clock output signal 458 and first clock output signal 460 is ε and no longer equal to the start offset of λ. Indeed, first clock output signal 460 leads by ε instead of lagging by λ. Consequently, the test DLL may be flagged as faulty in accordance with the present invention since the sampled binary value "10" in test dataset 462 is not the same as the binary "01" stored in the comparison dataset.

While examples and implementations have been described, they should not serve to limit any aspect of the present invention. Accordingly, implementations of the invention can be implemented in digital electronic circuitry, or in computer hardware, firmware, software, or in combinations of them. Apparatus of the invention can be implemented in a computer program product tangibly embodied in a machine readable storage device for execution by a programmable processor; and method steps of the invention can be performed by a programmable processor executing a program of instructions to perform functions of the invention by operating on input data and generating output. The invention can be implemented advantageously in one or more computer programs that are executable on a programmable system including at least one programmable processor coupled to receive data and instructions from, and to transmit data and instructions to, a data storage system, at least one input device, and at least one output device. Each computer program can be implemented in a high level procedural or object oriented programming language, or in assembly or machine language if desired; and in any case, the language can be a compiled or interpreted language. Suitable processors include, by way of example, both general and special purpose microprocessors. Generally, a processor will receive instructions and data from a read only memory and/or a random access memory. Generally, a computer will include one or more mass storage devices for storing data files; such devices include magnetic disks, such as internal hard disks and removable disks; magneto optical disks; and optical disks. Storage devices suitable for tangibly embodying computer program instructions and data include all forms of non-volatile memory, including by way of example semiconductor memory devices, such as EPROM, EEPROM, and flash memory devices; magnetic disks such as internal hard disks and removable disks; magneto optical disks; and CD ROM disks. Any of the foregoing can be supplemented by, or incorporated in, ASICs.

While specific embodiments have been described herein for purposes of illustration, various modifications may be made without departing from the spirit and scope of the invention. Indeed, aspects of the present invention are described with respect to a DDR controller as an interface for DDR memory however a DLL BIST may be applied in many other circuits. For example, a DLL BIST may also be implemented in a quad-data rate (QDR) memory interface, clock skew compensation, frequency multiplication and frequency division circuitry. Accordingly, the invention is not limited to the above-described implementations, but instead is defined by the appended claims in light of their full scope of equivalents.

What is claimed is:

1. A built-in self-test system for use in circuitry having two or more delay locked loops (DLLs), comprising:
   a first DLL having a first delay input, a first clock input disposed to receive a clock input signal and a first clock output providing a first clock output signal delayed in comparison with the clock input signal;
   a second DLL having a second delay input, a second clock input disposed to receive the clock input signal and a second clock output providing a second clock output signal delayed in comparison with the clock input signal;
   a test controller provides a first delay amount over the first delay input of the first DLL to create a start offset between the first clock output signal and the second clock output signal and further provides at least one common delay amount to both the first delay input of the first DLL and the second delay input of the second DLL, wherein the at least one common delay amount modifies delays of the first clock output signal and second clock output signal;
   a sample component that creates a test dataset by sampling the second clock output signal from the second DLL during at least one edge of the first clock output signal from the first DLL, wherein the test dataset stores samples of the second clock output signal; and
   a compare component that performs a comparison of the test dataset with a comparison dataset and produces a comparison result from the comparison of the test dataset and comparison dataset, wherein the comparison result indicates if the first DLL is functioning properly or is not functioning properly, and wherein the comparison dataset comprises data that is expected when comparing the first clock output signal from the first DLL with the second clock output signal from the second DLL.

2. The system of claim 1 wherein the circuitry having two or more DLLs is selected from a set of circuits including: a double-data rate (DDR) memory interface, a quad-data rate (QDR) memory interface, a clock skew compensation circuit, a frequency multiplication circuit and a frequency division circuit.

3. The system of claim 1 wherein the first clock output signal from the first DLL lags the second clock output signal from the second DLL by the start offset.

4. The system of claim 1 wherein the first clock output signal from the first DLL leads the second clock output signal from the second DLL by the start offset.

5. The system of claim 1 wherein the test dataset includes a first sample taken from the second clock output signal of the second DLL during a positive edge from the first clock output signal of the first DLL and a second sample taken from the second clock output signal of the second DLL during a negative edge from the first clock output signal of the first DLL.

6. The test controller of claim 1 further comprising logic that selects a pair of DLLs from two or more DLLs in the circuitry, wherein one DLL from the selected pair is the first DLL and another DLL from the selected pair is the second DLL.

7. A built-in self-test method for two or more delay locked loop (DLLs) comprising the steps of:
   providing a clock input signal to a first DLL and the clock input signal to a second DLL, wherein the clock input signal delayed by the first DLL corresponds to a first clock output signal and the clock input signal delayed by the second DLL corresponds to a second clock output signal;
   initializing the first DLL with a first delay amount causing the first clock output signal from the first DLL to become offset from the second clock output signal of the second DLL by a start offset;
   modifying both the first delay amount provided to the first DLL and a second delay amount provided to the second DLL by a common delay amount selected from a set of common delay amounts;
   determining if modifying both the first delay amount to the first DLL and the second delay amount to the second DLL by the common delay amount causes a change in the offset between the second clock output signal and the first clock output signal set to the start offset in the initializing step;
   wherein the determining step comprises performing a comparison of a test dataset with a comparison dataset and producing a comparison result from the comparison of the test dataset and comparison dataset, wherein the comparison result indicates if the first DLL is functioning properly or is not functioning properly, wherein the test dataset comprises samples of the second clock output signal during at least one edge of the first clock output signal, and wherein the comparison dataset comprises data that is expected when comparing the first clock output signal from the first DLL with the second clock output signal from the second DLL; and
   indicating the first DLL may not be functioning properly when the determining step indicates that the start offset set initially between the first clock output signal and the second clock output signal has changed in response to modifying both the first delay amount and the second delay amount by the common delay amount.

8. The method of claim 7 wherein the circuitry having two or more DLLs is selected from a set of circuits including: a double-data rate (DDR) memory interface, a quad-data rate (QDR) memory interface, a clock skew compensation circuit, a frequency multiplication circuit and a frequency division circuit.

9. The method of claim 7 wherein initializing the first DLL with the first delay amount causes the first clock output signal from the first DLL to lead the second clock output signal from the second DLL by the start offset.

10. The method of claim 7 wherein initializing the first DLL with the first delay input causes the first clock output signal from the first DLL to lag the second clock output signal from the second DLL by the start offset.

11. The method of claim 7 wherein the determining step further comprises the steps of:
   receiving a comparison dataset with values expected from the second clock output signal when the first DLL is operating properly;
   creating a test dataset by sampling values from the second clock output signal of the second DLL on at least one edge of the first clock output signal of the first DLL; and comparing the comparison dataset with the test dataset as an indication of the offset between the first clock output signal and the second clock output signal.

12. The method of claim 11 wherein creating the test dataset further comprises:
generating a first sample of the second clock output signal from the second DLL when there is a positive edge from the first clock output signal of the first DLL; and
generating a second sample of the second clock output signal from the second DLL when there is a negative edge from the first clock output signal of the first DLL.

13. The method of claim 11 wherein the offset is approximately the same as the start offset when the step of comparing results in the comparison dataset matching the test dataset.

14. The method of claim 11 wherein the offset is not approximately the same as the start offset when the step of comparing results in the comparison dataset not matching the test dataset.

15. A computer program product for operating a built-in self-test for two or more delay locked loop (DLLs), tangibly stored on a computer readable medium, comprising instructions operable to cause a programmable processor to:
provide a clock input signal to a first DLL and to a second DLL, wherein the clock input signal delayed by the first DLL corresponds to a first clock output signal and the clock input signal delayed by the second DLL corresponds to a second clock output signal;
initialize the first DLL by a first delay amount that causes the first clock output signal of the first DLL to be offset from the second clock output signal of the second DLL by a start offset;
modify both the first delay amount provided to the first DLL and a second delay amount provided to the second DLL by a common delay amount selected from a set of common delay amounts;
determine if modifying both the first delay amount to the first DLL and the second delay amount to the second DLL by the common delay amount causes a change in the offset between the second clock output signal and the first clock output signal set initially to the start offset;
wherein the instructions that determine if modifying both the first delay amount to the first DLL and the second delay amount to the second DLL by the common delay amount further comprises instructions operable to cause the programmable processor to perform a comparison of a test dataset with a comparison dataset and produce a comparison result from the comparison of the test dataset and comparison dataset, wherein the comparison result indicates if the first DLL is functioning properly or is not functioning properly, wherein the test dataset comprises samples of the second clock output signal during at least one edge of the first clock output signal, and wherein the comparison dataset comprises data that is expected when comparing the first clock output signal from the first DLL with the second clock output signal from the second DLL; and
indicate that the first DLL may not be functioning properly when the offset between the second clock output signal and the first clock output has changed from the start offset in response to a modification of both the first delay amount and the second delay amount by the common delay amount.

16. The computer program product of claim 15 wherein the circuitry having two or more DLLs is selected from a set of circuits including: a double-data rate (DDR) memory interface, a quad-data rate (QDR) memory interface, a clock skew compensation circuit, a frequency multiplication circuit and a frequency division circuit.

17. The computer program product of claim 15 wherein the change to the first delay amount causes the first clock output signal from the first DLL to lead the second clock output signal from the second DLL by the start offset.

18. The computer program product of claim 15 wherein the change to the first delay amount causes the first clock output signal from the first DLL to lag the second clock output signal from the second DLL by the start offset.

19. The computer program product of claim 15 wherein the instructions that determine the change in the offset further comprises instructions operable to cause the programmable processor to:
receive the comparison dataset with values expected from the second clock output signal when the first DLL is operating properly;
create the test dataset by measuring values from the second clock output signal on at least one edge of the first clock output signal; and
compare the comparison dataset with the test dataset as an indication of the offset between the first clock output signal and the second clock output signal.

20. The computer program product of claim 19 wherein the start offset has not changed when the comparison results in the comparison dataset match the test dataset.

21. The computer program product of claim 19 wherein the start offset has changed when the comparison results in the comparison dataset do not match the test dataset.

22. The computer program product of claim 15 wherein the instructions that create the test dataset further comprises instructions operable to cause the programmable processor to:
generate a first sample of the second clock output signal from the second DLL when there is a positive edge from the first clock output signal of the first DLL; and
generate a second sample of the second clock output signal from the second DLL when there is a negative edge from the first clock output signal of the first DLL.

23. A method for built-in self-testing for use in circuitry having two or more delay locked loops (DLLs), the method comprising:
receiving, by a first DLL, a clock input signal and providing, by the first DLL, a first clock output signal delayed in comparison with the clock input signal;
receiving, by the second DLL, the clock input signal and providing, by the second DLL, a second clock output signal delayed in comparison with the clock input signal;
providing a first delay amount to the first DLL to create a start offset between the first clock output signal and the second clock output signal and further providing at least one common delay amount to both the first DLL and the second DLL, wherein the at least one common delay amount modifies delays of the first clock output signal and second clock output signal;
creating a test dataset by sampling the second clock output signal from the second DLL during at least one edge of the first clock output signal from the first DLL, wherein the test dataset stores samples of the second clock output signal; and
performing a comparison of the test dataset with a comparison dataset and producing a comparison result from the comparison of the test dataset and comparison dataset, wherein the comparison result indicates if the first DLL is functioning properly or is not functioning properly, and wherein the comparison dataset comprises data that is expected when comparing the first clock output signal from the first DLL with the second clock output signal from the second DLL.

24. The method of claim 23 wherein creating the test dataset further comprises:
  generating a first sample of the second clock output signal from the second DLL when there is a positive edge from the first clock output signal of the first DLL; and
  generating a second sample of the second clock output signal from the second DLL when there is a negative edge from the first clock output signal of the first DLL.

25. An article of manufacture, comprising:
  a non-transient computer-readable medium having stored thereon instructions operable to permit an apparatus to:
  receive, by a first DLL, a clock input signal and provide, by the first DLL, a first clock output signal delayed in comparison with the clock input signal;
  receive, by the second DLL, the clock input signal and provide, by the second DLL, a second clock output signal delayed in comparison with the clock input signal;
  provide a first delay amount to the first DLL to create a start offset between the first clock output signal and the second clock output signal and further provide at least one common delay amount to both the first DLL and the second DLL, wherein the at least one common delay amount modifies delays of the first clock output signal and second clock output signal;
  create a test dataset by sampling the second clock output signal from the second DLL during at least one edge of the first clock output signal from the first DLL, wherein the test dataset stores samples of the second clock output signal; and
  perform a comparison of the test dataset with a comparison dataset and produce a comparison result from the comparison of the test dataset and comparison dataset, wherein the comparison result indicates if the first DLL is functioning properly or is not functioning properly, and
  wherein the comparison dataset comprises data that is expected when comparing the first clock output signal from the first DLL with the second clock output signal from the second DLL.

26. The article of manufacture of claim 25 wherein the instructions operable to permit the apparatus to create the test dataset further comprises instructions operable to permit the apparatus to:
  generate a first sample of the second clock output signal from the second DLL when there is a positive edge from the first clock output signal of the first DLL; and
  generate a second sample of the second clock output signal from the second DLL when there is a negative edge from the first clock output signal of the first DLL.

* * * * *